United States Patent
Kimura et al.

(10) Patent No.: US 9,823,691 B2
(45) Date of Patent: Nov. 21, 2017

(54) SEMICONDUCTOR STORAGE DEVICE

(71) Applicant: Toshiba Memory Corporation, Minato-ku (JP)

(72) Inventors: Fumiaki Kimura, Kawasaki (JP); Yoshimichi Sakai, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/060,834

(22) Filed: Mar. 4, 2016

(65) Prior Publication Data

US 2017/0023970 A1 Jan. 26, 2017

Related U.S. Application Data

(60) Provisional application No. 62/195,983, filed on Jul. 23, 2015.

(51) Int. Cl.
| | |
|---|---|
| *H05K 7/20* | (2006.01) |
| *G06F 1/16* | (2006.01) |
| *G06F 1/20* | (2006.01) |
| *G06F 3/06* | (2006.01) |
| *G11C 5/02* | (2006.01) |

(52) U.S. Cl.
CPC .......... *G06F 1/16* (2013.01); *G06F 1/20* (2013.01); *G06F 3/0679* (2013.01); *G11C 5/02* (2013.01); *H05K 7/20472* (2013.01); *G06F 2212/214* (2013.01)

(58) Field of Classification Search
CPC .................................................. H05K 7/2039
See application file for complete search history.

(56) References Cited

U.S. PATENT DOCUMENTS

| | | | | |
|---|---|---|---|---|
| 5,208,732 | A * | 5/1993 | Baudouin | G06K 19/077 257/713 |
| 5,437,041 | A * | 7/1995 | Wakabayashi | B41J 5/44 361/712 |
| 6,128,194 | A * | 10/2000 | Francis | H05K 5/0269 235/492 |
| 6,982,482 | B2 | 1/2006 | Glidden et al. | |
| 7,035,108 | B2 * | 4/2006 | Wakabayashi | B41J 29/377 257/719 |
| 7,061,774 | B2 | 6/2006 | Zhang | |
| 7,130,195 | B2 * | 10/2006 | Kawano | H05K 7/20518 165/80.2 |
| 8,787,022 | B2 | 7/2014 | Moriai et al. | |
| 2003/0179548 | A1 * | 9/2003 | Becker | H05K 1/0204 361/704 |
| 2014/0268574 | A1 * | 9/2014 | Itoi | H01L 23/5389 361/712 |

(Continued)

FOREIGN PATENT DOCUMENTS

| | | |
|---|---|---|
| JP | 2011-146497 | 7/2011 |
| JP | 2011-249581 | 12/2011 |
| JP | 2014-49536 | 3/2014 |

*Primary Examiner* — Anthony Q Edwards
(74) *Attorney, Agent, or Firm* — Oblon, McClelland, Maier & Neustadt, L.L.P.

(57) ABSTRACT

According to one embodiment, a semiconductor storage device includes a first substrate, a casing, a first non-volatile memory, a controller, and a first member. The first member connects thermally the first substrate and the casing. At least a portion of the first member is positioned between the first non-volatile memory and the controller.

20 Claims, 13 Drawing Sheets

(56) References Cited

U.S. PATENT DOCUMENTS

| | | | |
|---|---|---|---|
| 2015/0118391 A1* | 4/2015 | Kilhenny | F21V 29/004 427/97.2 |
| 2016/0050744 A1* | 2/2016 | Lee | H05K 1/0206 361/712 |
| 2017/0023970 A1* | 1/2017 | Kimura | G06F 3/0679 |

* cited by examiner

SEMICONDUCTOR STORAGE DEVICE

CROSS-REFERENCE TO RELATED APPLICATIONS

This application is based upon and claims the benefit of priority from U.S. Provisional Application No. 62/195,983, filed on Jul. 23, 2015; the entire contents of which are incorporated herein by reference.

FIELD

Embodiments described herein relate generally to a semiconductor storage device.

BACKGROUND

Device such as a semiconductor storage device has a plurality of electronic components such as a non-volatile memory and a controller. When the device operates, these electronic components may generate heat.

DETAILED DESCRIPTION

In general, according to one embodiment, a semiconductor storage device including: a first substrate including a first face and a second face on the side opposite to the first face; a casing housing the first substrate; a first non-volatile memory mounted on the first face; a controller mounted on the first face or the second face, the controller configured to control the first non-volatile memory; and a first member mounted on the first face or the second face, the first member configured to connect thermally the first substrate and the casing, at least a portion of the first member positioned between the first non-volatile memory and the controller.

Exemplary embodiments of a semiconductor storage device will be explained below in detail with reference to the accompanying drawings. The present invention is not limited to the following embodiments.

First Embodiment

A first embodiment will be described below with reference to FIGS. 1 to 5. The designations of constituent elements of the embodiment and descriptions thereof may be provided in a plurality of expressions. However, this does not prevent the use of any other expressions not used herein for the designations of the constituent elements and descriptions thereof. In addition, this does not prevent the provision of the designations of the constituent elements and descriptions thereof not provided here in a plurality of expressions, in any other expressions.

Figure 1:
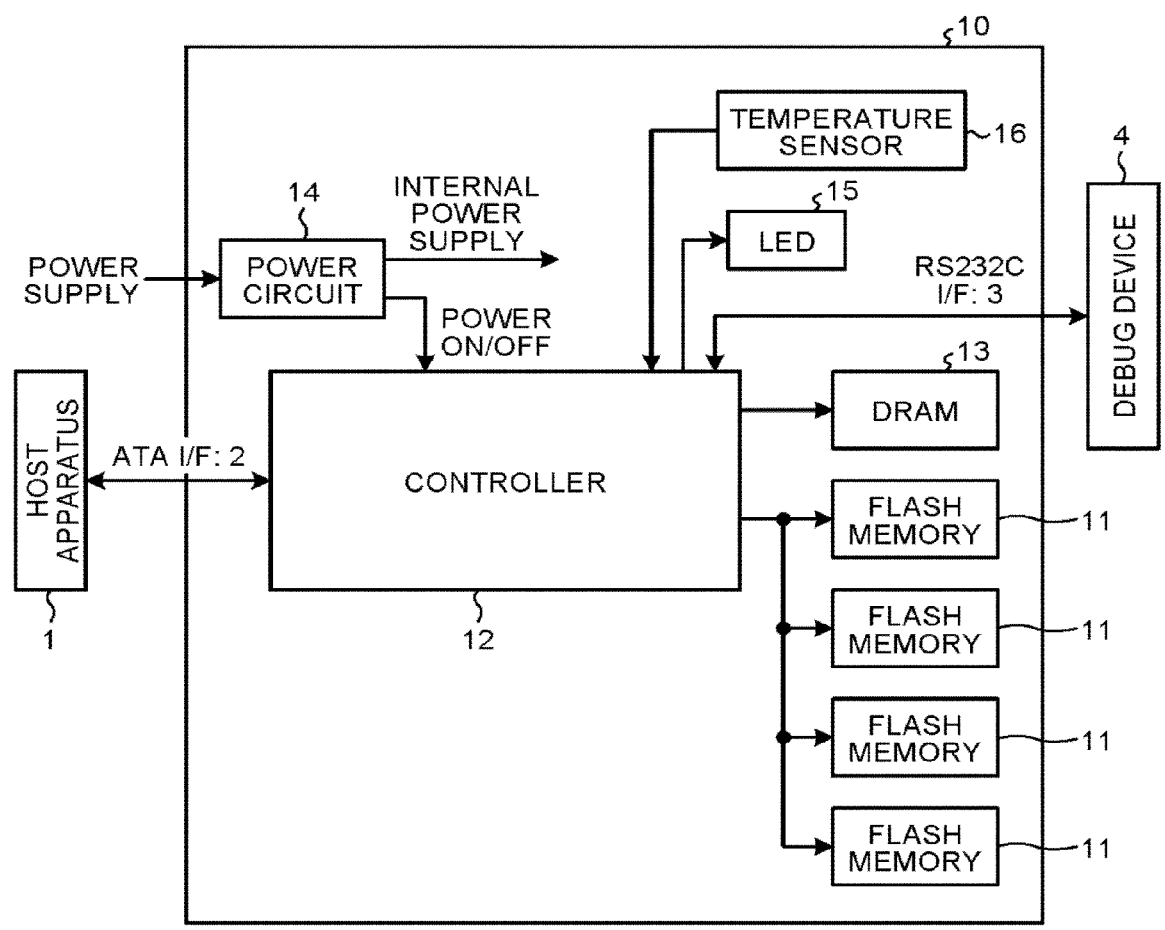
FIG. 1 is a block diagram showing a configuration example of an SSD according to a first embodiment.

FIG. 1 is a block diagram showing a configuration example of a solid-state drive (SSD) 10 according to the first embodiment. The SSD 10 is an example of a semiconductor storage device and may be also called storage device, electronic device, device, or component, for example. The semiconductor storage device is not limited to the SSD 10 but may be any other device such as a hybrid hard disc drive (hybrid HDD), for example.

The SSD 10 is connected to a host device (hereinafter, referred to as host) 1 via a connection interface (I/F) 2. The SSD 10 is used as an auxiliary storage device for the host 1, for example. As the connection interface 2, communication standards such as SATA (Serial Advanced Technology Attachment), PCI Express (Peripheral Component Interconnect Express, PCIe), USB (Universal Serial Bus), and SAS (Serial Attached SCSI) are applicable.

The host 1 is a CPU in a server, a personal computer, a tablet, a smartphone, or a mobile phone, or a CPU in an imaging device such as a still camera or a video camera, for example. However, the host 1 is not limited to them.

The SSD 10 can exchange data with another device such as a debug device 4 via a communication interface 3 such as RS232C interface (RS232C I/F).

The SSD 10 has a plurality of flash memories 11, a controller 12, dynamic random access memory (DRAM) 13, a power circuit 14, an LED 15, and a temperature sensor 16.

The flash memories 11 are an example of first and second non-volatile memories, and may be also called non-volatile semiconductor storage elements, electronic components, storage elements, semiconductor elements, storage units, elements, or components, for example. The controller 12 may be also called drive control circuit, electronic component, control unit, element, or component, for example. The DRAM 13 is an example of a volatile memory, and may be also called volatile semiconductor storage element, electronic component, storage element, semiconductor element, storage unit, element, or component, for example.

The flash memories 11 are NAND-type flash memories, for example. The flash memories 11 may be any other flash memories. The DRAM 13 is capable of a higher-speed storage action than the flash memories 11. The LED 15 is used to indicate the status of the SSD 10. The temperature sensor 16 detects the internal temperature of the SSD 10.

The controller 12 is a system-on-a-chip (SoC), for example. The controller 12 may be any other integrated circuit (IC) or circuit. The controller 12 controls the flash memories 11, the DRAM 13, the power circuit 14, the LED 15, and the temperature sensor 16, for example.

The power circuit 14 generates a plurality of different internal direct-current power-supply voltages from an external direct-current power source supplied by a power circuit at the host 1 side. The power circuit 14 supplies these internal direct-current power-supply voltages to the circuits in the SSD 10. The power circuit 14 detects the rising of the external power source, and generates a power-on reset signal and supplies the same to the controller 12.

Figure 2:
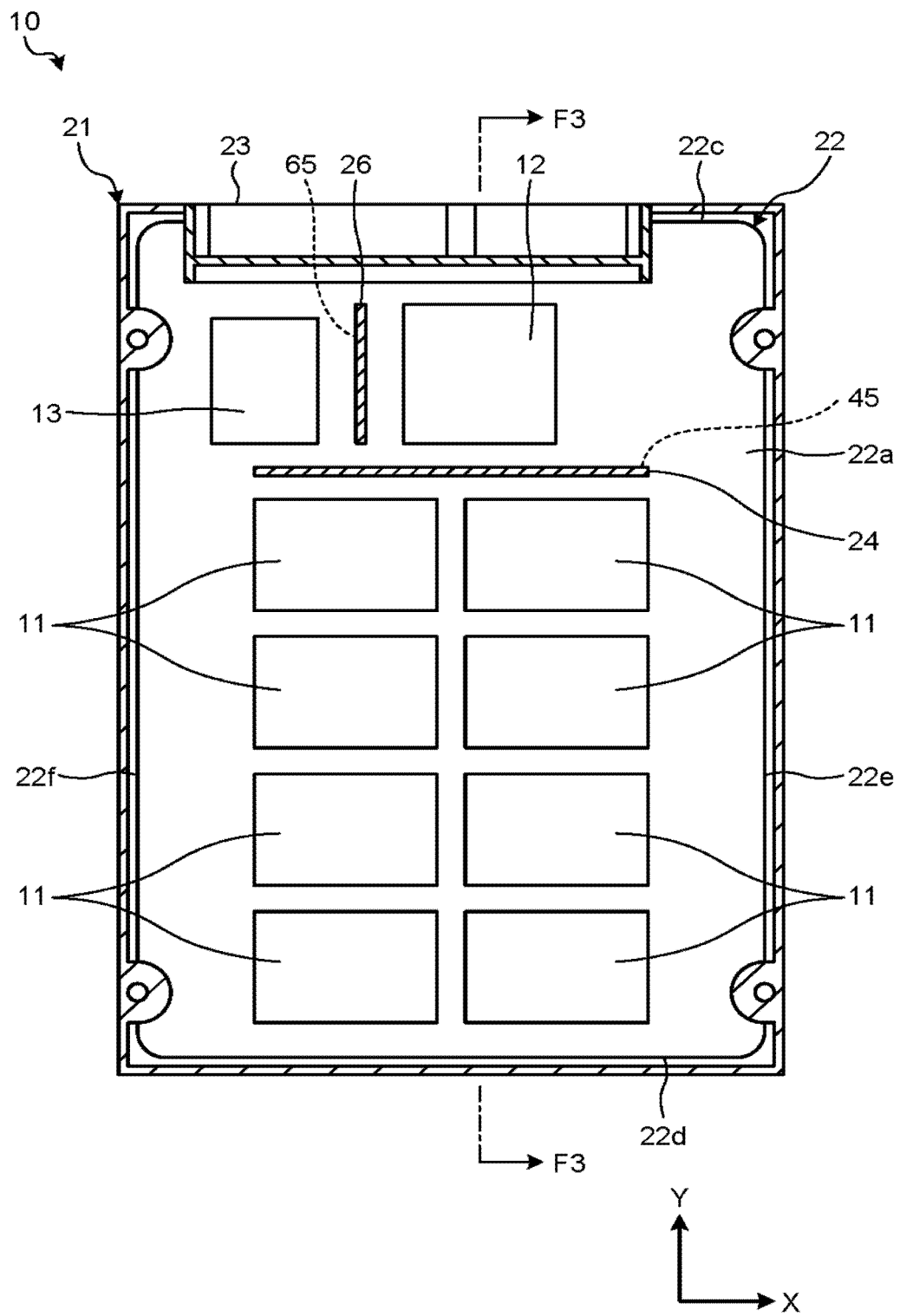
FIG. 2 is a cross-sectional view showing the SSD in the first embodiment.
Figure 3:
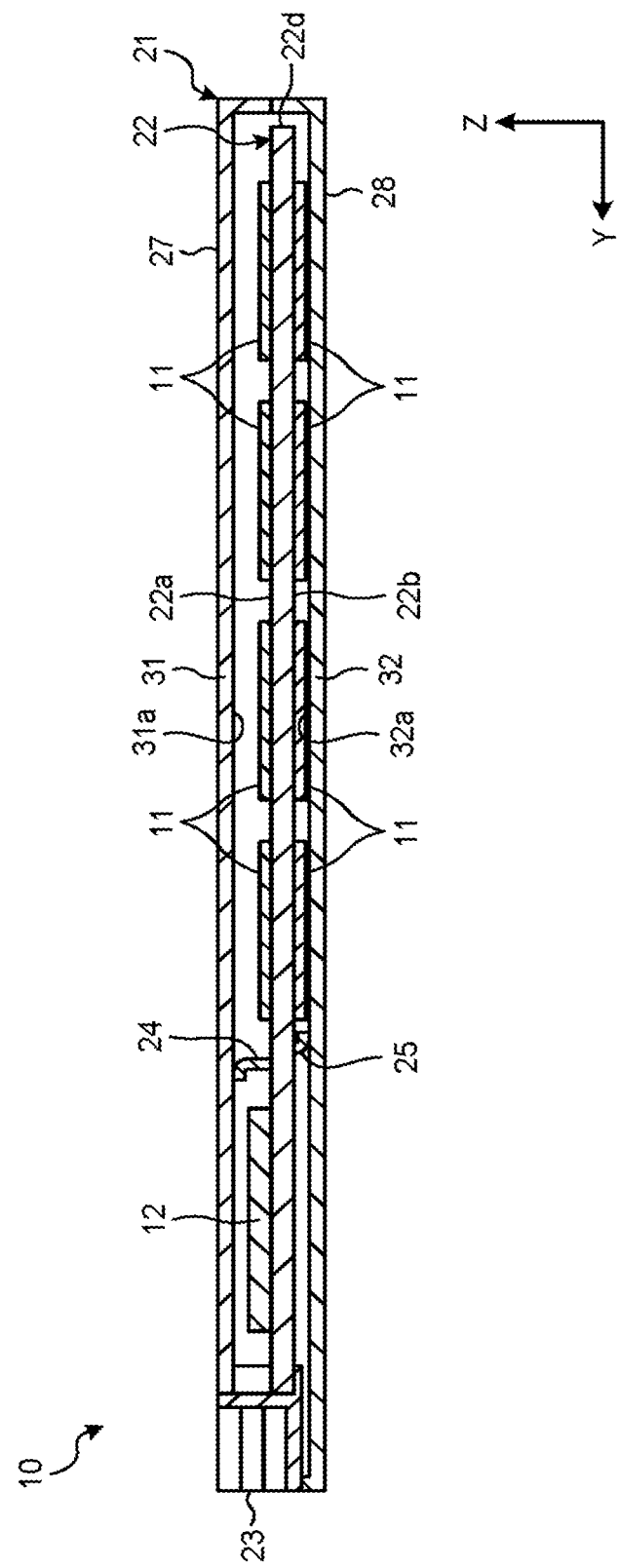
FIG. 3 is a cross-sectional view showing the SSD in the first embodiment taken along line F3-F3 illustrated in FIG. 2.

FIG. 2 is a cross-sectional view showing the SSD 10 in the first embodiment. FIG. 3 is a cross-sectional view showing the SSD 10 in the first embodiment taken along line F3-F3 illustrated in FIG. 2. As illustrated in the drawings, an X axis, a Y axis, and a Z axis are defined herein. The X axis, the Y axis, and the Z axis are orthogonal to one another. The X axis extends along the width of the SSD 10. The Y axis extends along the length of the SSD 10. The Z axis extends along the thickness of the SSD 10.

As illustrated in FIGS. 2 and 3, the SSD 10 has a casing 21, a first substrate 22, an external connector 23, a first wall 24, a second wall 25, and a third wall 26. The casing 21 may be also called cover, covering portion, or wall, for example. The first substrate 22 may be also called wiring board or member, for example. Each of the first wall 24 and the second wall 25 is an example of a first member and wall. The third wall 26 is an example of a second member.

The casing 21 is formed as a substantially cuboidal box shape and houses the first substrate 22. As illustrated in FIG. 3, the casing 21 has a first cover 27 and a second cover 28. For example, the casing 21 is formed by screwing the first cover 27 into the second cover 28.

The first cover 27 is made of metal, for example. The first cover 27 may also be made of another material such as a synthetic resin, for example. The first cover 27 has a substantially rectangular first covering wall 31. The first covering wall 31 is an example of an external member. The first covering wall 31 has a first inner face 31a.

The second cover 28 is made of the same material as that for the first cover 27, for example. The material for the second cover 28 may be different from the material for the first cover 27. The second cover 28 has a substantially rectangular second covering wall 32. The second covering wall 32 is an example of an external member. The second covering wall 32 has a second inner face 32a. The second inner face 32a is opposed to the first inner face 31a.

The first substrate 22 is a multilayered printed circuit board (PCB) having a plurality of conductor layers and a plurality of insulation layers, for example. The first substrate 22 may be any other substrate such as a flexible printed wiring board (FPC). The first substrate 22 is positioned between the first cover 27 and the second cover 28. The first substrate 22 in this embodiment has an almost rectangular shape in a plane view as seen from the direction along the Z axis. The first substrate 22 has short sides along the X axis and long sides along the Y axis.

The first substrate 22 has a first mounting face 22a and a second mounting face 22b. The first mounting face 22a is an example of a first face and is formed substantially flat. The second mounting face 22b is an example of a second face and is formed substantially flat. The second mounting face 22b is positioned on the side opposite to the first mounting face 22a.

The first mounting face 22a of the first substrate 22 is opposed to the first inner face 31a of the first covering wall 31. The first mounting face 22a is arranged at a position separated from the first inner face 31a of the first covering wall 31. The first mounting face 22a may be in partial contact with the first inner face 31a.

The second mounting face 22b of the first substrate 22 is opposed to the second inner face 32a of the second covering wall 32. The second mounting face 22b is arranged at a position separated from the second inner face 32a of the second covering wall 32. The second mounting face 22b may be in partial contact with the second inner face 32a.

As illustrated in FIG. 2, the first substrate 22 has a first end portion 22c, a second end portion 22d, a third end portion 22e, and a fourth end portion 22f. The first end portion 22c is one end portion of the first substrate 22 along the Y axis. The second end portion 22d is the other end portion of the first substrate 22 along the Y axis. The first and second end portions 22c and 22d are the short sides of the first substrate 22 formed in an almost rectangular shape. The third end portion 22e is one end portion of the first substrate 22 along the X axis. The fourth end portion 22f is the other end portion of the first substrate 22 along the X axis. The third and fourth end portions 22e and 22f are the long sides of the first substrate 22 formed in an almost rectangular shape.

Each of the first to fourth end portions 22c to 22f includes not only an edge of the first substrate 22 but also part adjacent to the edge of the first substrate 22. That is, each of the first to fourth end portions 22c to 22f includes some part of the first mounting face 22a and some part of the second mounting face 22b.

Figure 4:
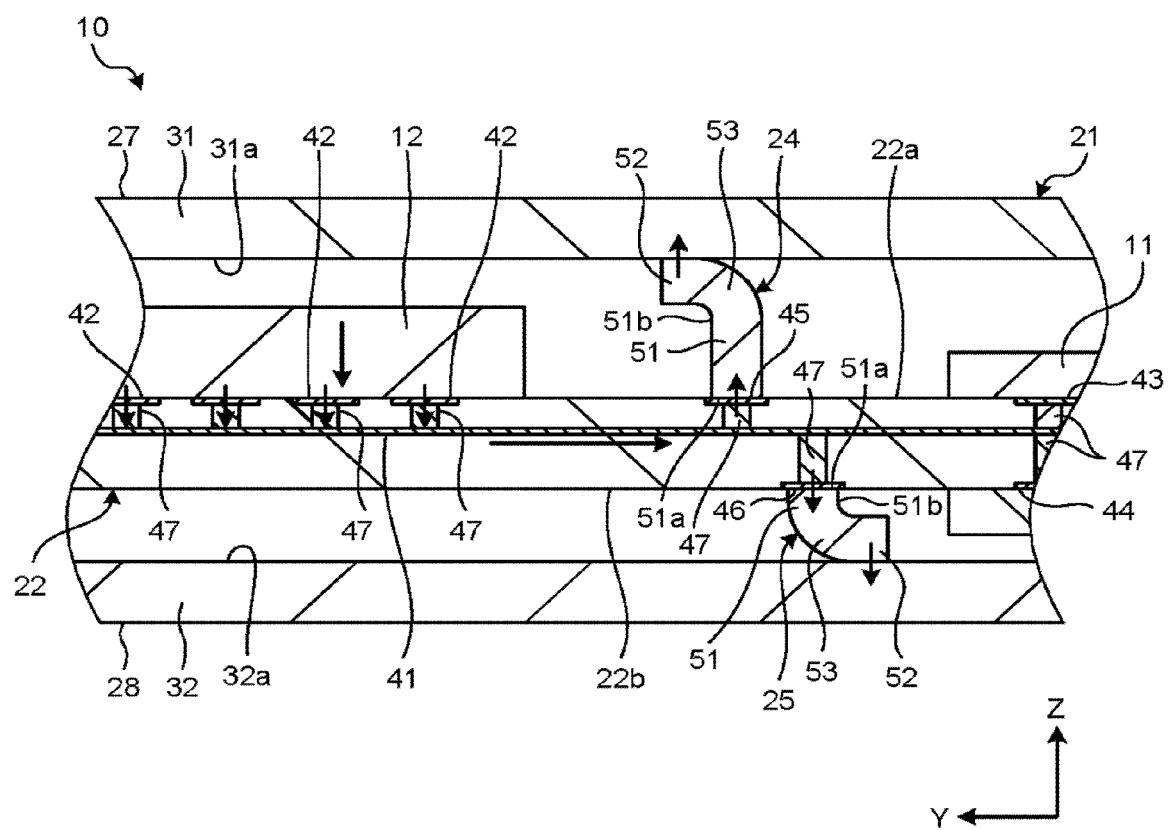
FIG. 4 is a cross-sectional view showing a portion of the SSD in the first embodiment.

FIG. 4 is a cross-sectional view showing a portion of the SSD 10 in the first embodiment. As illustrated in FIG. 4, the first substrate 22 has a ground layer 41, a plurality of first pads 42, a plurality of second pads 43, a plurality of third pads 44, a first land 45, a second land 46, and a plurality of vias 47.

The ground layer 41 is an example of a conductor layer. The conductor layer may be any other conductor layer such as a power layer, for example. Each of the first and second lands 45 and 46 is an example of land, and may be also called a conductive unit, a metal portion, an exposed portion, or a portion, for example.

The ground layer 41 is a metal layer provided inside the first substrate 22. The first and second pads 42, 43 and the first land 45 are conductors exposed on the first mounting face 22a. The third pads 44 and the second land 46 are conductors exposed on the second mounting face 22b.

The vias 47 are provided inside the first substrate 22. The plurality of vias 47 connects electrically the ground layer 41 and the plurality of first pads 42, connects electrically the ground layer 41 and the plurality of second pads 43, and connects electrically the ground layer 41 and the plurality of third pads 44. The plurality of vias 47 further connects electrically the ground layer 41 and the first land 45, and connects electrically the ground layer 41 and the second land 46.

The vias 47 are made of metal. Accordingly, the plurality of vias 47 also connects thermally the ground layer 41 and the plurality of first pads 42, connects thermally the ground layer 41 and the plurality of second pads 43, and connects thermally the ground layer 41 and the plurality of third pads 44. The plurality of vias 47 further connects thermally the ground layer 41 and the first land 45, and connects thermally the ground layer 41 and the second land 46. Therefore, the first pads 42 are electrically and thermally connected to the first land 45, and electrically and thermally connected to the second land 46, via the ground layer 41 and the vias 47.

Besides the ground layer 41, the first pads 42, the second pads 43, the third pads 44, the first land 45, the second land 46, and the vias 47, the first substrate 22 is provided with various wiring patterns. By these wiring patterns, the plurality of flash memories 11, the controller 12, the DRAM 13, the power circuit 14, the LED 15, and the temperature sensor 16 are electrically and thermally connected to one another.

The terminals of some of the flash memories 11 are electrically connected to the second pads 43 by soldering, for example. The terminals of the other flash memories 11 are electrically connected to the third pads 44 by soldering, for example. Accordingly, the plurality of flash memories 11 are mounted on the first mounting face 22a and the second mounting face 22b of the first substrate 22. The flash memories 11 may be mounted on either the first mounting face 22a or the second mounting face 22b.

The flash memories 11 mounted on the first mounting face 22a of the first substrate 22 overlap the flash memories 11 mounted on the second mounting face 22b in the direction of thickness of the first substrate 22 (along the Z axis). The position of the flash memories 11 mounted on the first mounting face 22a and the position of the flash memories 11 mounted on the second mounting face 22b are not limited to the foregoing ones.

The terminals of the controller 12 are electrically connected to the first pads 42 by soldering, for example. Accordingly, the controller 12 is mounted on the first mounting face 22a of the first substrate 22. The controller 12 may be mounted on the second mounting face 22b.

The controller 12 is mounted on the first mounting face 22a of the first substrate 22 at a position separated from the flash memories 11. In other words, when the first mounting face 22a is seen in a plane view, the controller 12 is arranged at a position separated from the flash memories 11.

As illustrated in FIG. 2, the DRAM 13 is mounted on the first mounting face 22a of the first substrate 22 as the controller 12 is. The DRAM 13 is arranged at a position separated from the controller 12. In other words, when the first mounting face 22a is seen in a plane view, the DRAM 13 is arranged at a position separated from the controller 12. The DRAM 13 may be mounted on the second mounting face 22b.

The external connector 23 is mounted on the first substrate 22 at the first end portion 22c of the first substrate 22. The external connector 23 is connected to the host 1, for example, and is used as the SATA interface 2 and the communication interface 3 describe above. The external connector 23 is also used as a power input unit to supply power from the host 1 to the power circuit 14.

In the direction along the Y axis, the controller 12 is positioned between the external connector 23 and the plurality of flash memories 11. Similarly, in the direction along the Y axis, the DRAM 13 is positioned between the external connector 23 and the plurality of flash memories 11. The controller 12 and the DRAM 13 are arranged in the direction along the X axis.

Figure 5:
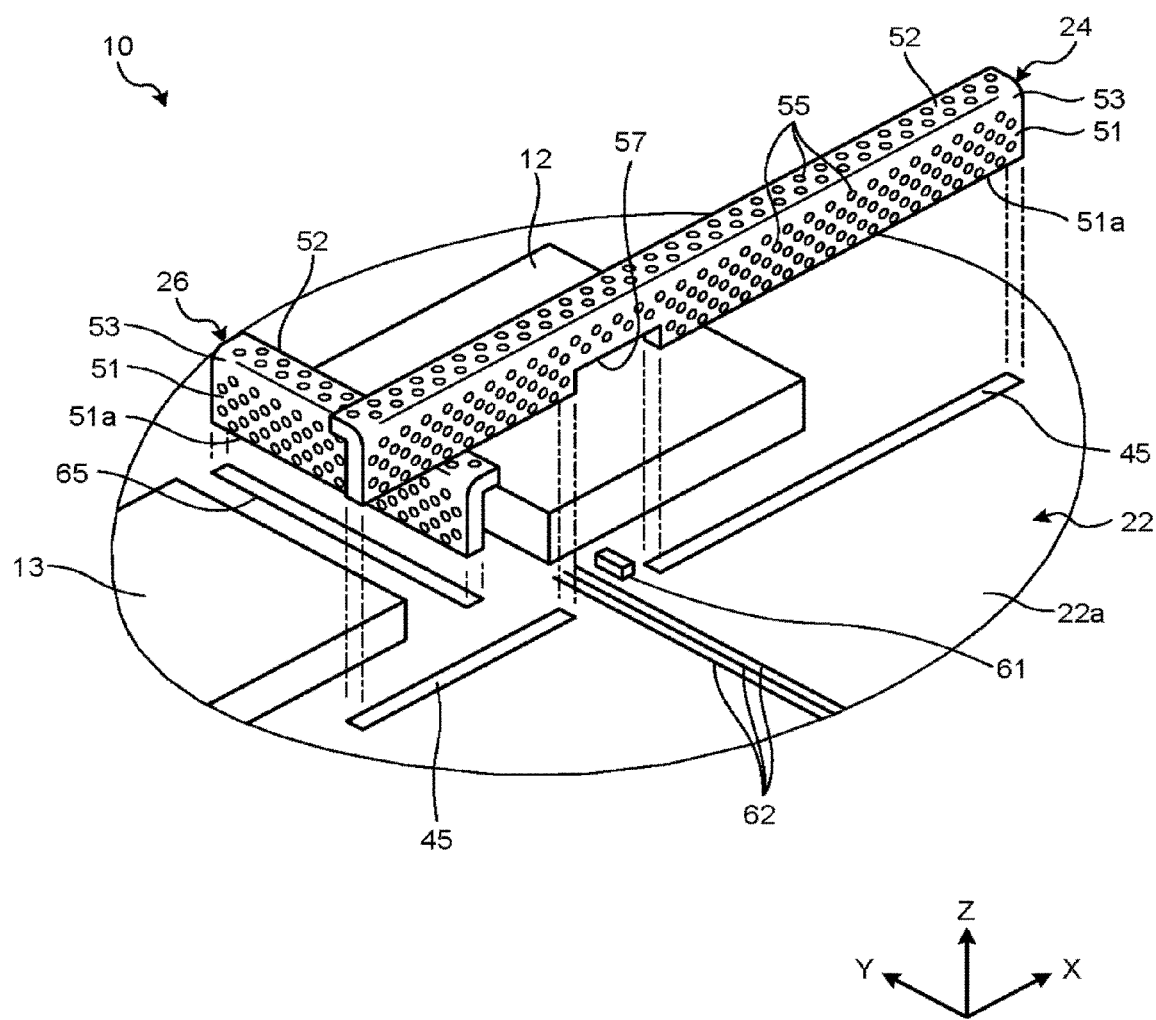
FIG. 5 is a perspective view showing an internal part of the SSD according to the first embodiment.

FIG. 5 is a perspective view showing an internal part of the SSD 10 according to the first embodiment. The first wall 24 is made of metal. The first wall 24 may be made from another material. The first wall 24 has higher thermal conductivity than that of the insulation layer of the first substrate 22, for example.

As illustrated in FIG. 5, the first wall 24 is extended in the direction along the X axis. In other words, the first wall 24 is extended in the direction (along the X axis) crossing the direction from the flash memories 11 toward the controller 12 (along the Y axis).

As illustrated in FIG. 4, the first wall 24 has a first extended portion 51, a second extended portion 52, and a curved portion 53. The first extended portion 51 is a portion extended in the direction along the Z axis. The second extended portion 52 is a portion extending in the direction along the Y axis. The curved portion 53 is a portion connecting the first extended portion 51 and the second extended portion 52.

The first extended portion 51 has a first end portion 51a and a second end portion 51b in the direction along the Z axis. The first end portion 51a of the first extended portion 51 of the first wall 24 is attached to the first land 45 provided on the first mounting face 22a by soldering. In other words, the first extended portion 51 of the first wall 24 is attached to the first mounting face 22a. However, the first extended portion 51 is not limited to this but may be attached to the first land 45 by a thermally conductive adhesive or may be inserted into a hole formed in the first substrate 22, for example. The second end portion 51b of the first extended portion 51 is connected to the curved portion 53.

By soldering the first extended portion 51 to the first land 45, the first wall 24 is electrically and thermally connected to the first land 45. Accordingly, the first wall 24 is electrically and thermally connected to the controller 12 via the first land 45, the vias 47, the ground layer 41, and the first pads 42.

The curved portion 53 is substantially formed in an arc shape. In other words, the curved portion 53 is a portion curved in an arc of the first wall 24. By providing the curved portion 53, the first wall 24 is easy to elastically deform.

As illustrated in FIG. 5, the first wall 24 may be provided with a plurality of holes 55. In other words, the first wall 24 may be made of perforated metal. However, the first wall 24 is not limited to this but may be provided with slits as an example of holes or may be formed by a flat metal plate without hole, for example.

The first wall 24 is also provided with a cutout 57. The cutout 57 is an example of an opening. However, the opening is not limited to this but may be a hole, for example. The cutout 57 is provided at the first end portion 51a of the first extended portion 51.

An electronic component 61 such as a resistor, for example, is mounted on the first mounting face 22a of the first substrate 22. Further, a plurality of wires 62 is provided on the first mounting face 22a. The wires 62 are covered with insulation layers and may upraise the first mounting face 22a. Each of the electronic component 61 and the wires 62 is an example of element, and constitutes at least a portion of circuitry provided on the first substrate 22, for example.

The electronic component 61 and the wires 62 are passed through the cutout 57 of the first wall 24. In other words, the cutout 57 is formed to avoid the electronic component 61 and the wires 62. That is, the edges of the first wall 24 defining the cutout 57 are separated from the electronic component 61 and the wires 62.

As illustrated in FIG. 4, at least one of the second extended portion 52 and the curved portion 53 of the first wall 24 is brought into contact elastically with the first inner face 31a of the first covering wall 31 of the casing 21. When the curved portion 53 is deformed elastically, at least one of the second extended portion 52 and the curved portion 53 is pressed against the first inner face 31a.

When the first wall 24 is brought into contact with the first inner face 31a, the first wall 24 is thermally connected to the first covering wall 31 of the casing 21. Accordingly, the first wall 24 attached to the first substrate 22 connects thermally the first substrate 22 to the casing 21. For example, grease may intervene between the first wall 24 and the first inner face 31a.

The first land 45 is positioned between the flash memories 11 and the controller 12. Accordingly, the first wall 24 attached to the first land 45 is also positioned between the flash memories 11 and the controller 12. In other words, in a plane view of the first substrate 22, the first wall 24 is positioned on the side opposite to the external connector 23 as seen from the controller 12 and is positioned on the same side as the external connector 23 as seen from the flash memories 11.

As illustrated in FIG. 2, in the direction along the Y axis, the first wall 24 is positioned between the controller 12 and the second end portion 22*d* of the first substrate 22. However, the first wall 24 is provided so as not to be positioned between the controller 12 and the first end portion 22*c* in the direction along the Y axis, between the controller 12 and the third end portion 22*e* in the direction along the X axis, or between the controller 12 and the fourth end portion 22*f* in the direction along the X axis. However, the first wall 24 is not limited to this.

The second wall 25 is almost the same member as the first wall 24. The dimension of each of the sections of the second wall 25 may be different from the corresponding dimension of the first wall 24.

The second wall 25 is attached to the second mounting face 22*b* of the first substrate 22. The second wall 25 is made of metal. The second wall 25 may be made of another material. The second wall 25 made from another material is attached to the second mounting face 22*b* by a means such as a thermally conductive adhesive or another adhesive, for example. The second wall 25 has higher thermal conductivity than that of the insulation layer of the first substrate 22, for example.

The second wall 25 is extended in the direction along the X axis. In other words, the second wall 25 is extended in the direction (along the X axis) crossing the direction from the flash memories 11 toward the controller 12 (along the Y axis).

The second wall 25 has a first extended portion 51, a second extended portion 52, and a curved portion 53, as the first wall 24 does. The second wall 25 is provided with a plurality of holes 55. The second wall 25 may further be provided with a cutout 57.

A first end portion 51*a* of the first extended portion 51 of the second wall 25 is attached to the second land 46 provided on the second mounting face 22*b* by soldering. In other words, the first extended portion 51 of the second wall 25 is attached to the second mounting face 22*b*.

By soldering the first extended portion 51 to the second land 46, the second wall 25 is electrically and thermally connected to the second land 46. Accordingly, the second wall 25 is electrically and thermally connected to the controller 12 via the second land 46, the vias 47, the ground layer 41, and the first pads 42.

At least one of the second extended portion 52 and the curved portion 53 of the second wall 25 is brought into contact elastically with the second inner face 32*a* of the second covering wall 32 of the casing 21. When the curved portion 53 is deformed elastically, at least one of the second extended portion 52 and the curved portion 53 is pressed against the second inner face 32*a*.

When the second wall 25 is brought into contact with the second inner face 32*a*, the second wall 25 is thermally connected to the second covering wall 32 of the casing 21. Accordingly, the second wall 25 attached to the first substrate 22 connects thermally the first substrate 22 to the casing 21.

The second land 46 is positioned between the flash memories 11 and the controller 12 in a plane view of the first mounting face 22*a*. Accordingly, the second wall 25 attached to the second land 46 is also positioned between the flash memories 11 and the controller 12.

As illustrated in FIG. 5, the first substrate 22 is further provided with a third land 65. The third land 65 is a conductor exposed on the first mounting face 22*a* of the first substrate 22. The third land 65 is electrically and thermally connected to the ground layer 41 by the vias 47. Accordingly, the first pads 42 are electrically and thermally connected to the third land 65 via the ground layer 41 and the vias 47.

The third wall 26 is almost the same member as each of the first and second walls 24 and 25. The dimensions of each of the sections of the third wall 26 may be different from the corresponding dimension of the first and second walls 24 and 25.

The third wall 26 is attached to the first mounting face 22*a* of the first substrate 22. The third wall 26 is made of metal. The third wall 26 may be made of another material. The third wall 26 made of another material is attached to the first mounting face 22*a* by a means such as a thermally conductive adhesive or another adhesive, for example. The third wall 26 has higher thermal conductivity than that of the insulation layer of the first substrate 22, for example.

The third wall 26 is extended in the direction along the Y axis. In other words, the third wall 26 is extended in the direction (along the Y axis) crossing the direction from the controller 12 toward the DRAM 13 (along the X axis).

The third wall 26 has a first extended portion 51, a second extended portion 52, and a curved portion 53, as each of the first and second walls 24 and 25. The third wall 26 is provided with a plurality of holes 55. The third wall 26 may further be provided with a cutout 57.

A first end portion 51*a* of the first extended portion 51 of the third wall 26 is attached to the third land 65 provided on the first mounting face 22*a* by soldering. In other words, the first extended portion 51 of the third wall 26 is attached to the first mounting face 22*a*.

By soldering the first extended portion 51 to the third land 65, the third wall 26 is electrically and thermally connected to the third land 65. Accordingly, the third wall 26 is electrically and thermally connected to the controller 12 via the third land 65, the vias 47, the ground layer 41, and the first pads 42.

At least one of the second extended portion 52 and the curved portion 53 of the third wall 26 is brought into contact elastically with the first inner face 31*a* of the first covering wall 31 of the casing 21. When the curved portion 53 is deformed elastically, at least one of the second extended portion 52 and the curved portion 53 is pressed against the first inner face 31*a*.

When the third wall 26 is brought into contact with the first inner face 31*a*, the third wall 26 is thermally connected to the first covering wall 31 of the casing 21. Accordingly, the third wall 26 attached to the first substrate 22 connects thermally the first substrate 22 to the casing 21.

The third land 65 is positioned between the controller 12 and the DRAM 13 in a plane view of the first mounting face 22*a*. Accordingly, the third wall 26 attached to the third land 65 is also positioned between the controller 12 and the DRAM 13.

When the power circuit 14 supplies an internal direct-current power-supply voltage to the controller 12, the SSD 10 is activated. With the activation of the SSD 10, the flash memories 11, the controller 12, the DRAM 13 generates heat. The controller 12 generates a larger amount of heat than that of each of the flash memories 11. Further, the controller 12 generates a larger amount of heat than that of the DRAM 13.

As illustrated by arrows in FIG. 4, the heat generated by the controller 12 is conducted from the plurality of first pads 42 to the ground layer 41 via the vias 47. The heat in the ground layer 41 is directed form the region on which the controller 12 is arranged to the region on which the flash memories 11 are arranged.

The first wall 24 is provided between the controller 12 and the flash memories 11. Accordingly, the heat in the ground layer 41 is conducted to the first wall 24 via the vias 47 and the first land 45 before reaching the region on which the flash memories 11 are arranged.

The first wall 24 connects thermally the first substrate 22 to the first covering wall 31 of the casing 21. Accordingly, the heat conducted to the first wall 24 is then conducted to the first covering wall 31. The heat in the first covering wall 31 is discharged to the outside of the SSD 10.

Similarly, the second wall 25 is provided between the controller 12 and the flash memories 11. Accordingly, the heat in the ground layer 41 is conducted to the second wall 25 via the vias 47 and the second land 46 before reaching the region on which the flash memories 11 are arranged.

The second wall 25 connects thermally the first substrate 22 to the second covering wall 32 of the casing 21. Accordingly, the heat conducted to the second wall 25 is then conducted to the second covering wall 32. The heat in the second covering wall 32 is discharged to the outside of the SSD 10.

Further, the third wall 26 is provided between the controller 12 and the DRAM 13. Accordingly, the heat in the ground layer 41 is conducted to the third wall 26 before reaching the region on which the DRAM 13 is arranged.

The third wall 26 connects thermally the first substrate 22 to the first covering wall 31 of the casing 21. Accordingly, the heat conducted to the third wall 26 is then conducted to the first covering wall 31. The heat in the first covering wall 31 is discharged to the outside of the SSD 10.

As described above, the heat of the controller 12 is discharged from the casing 21 to the outside of the SSD 10 through the first to third walls 24 to 26. This reduces the heat transferred from the controller 12 generating a relatively large amount of heat to the flash memories 11 and the DRAM 13.

In the SSD 10 according to the first embodiment, the first wall 24 connecting thermally the first substrate 22 to the casing 21 is attached to the first mounting face 22a of the first substrate 22 between the flash memories 11 and the controller 12. Accordingly, the heat transferred from one of the flash memories 11 and the controller 12 to the first substrate 22 is conducted by the first wall 24 to the casing 21 before being transferred to the other. In other words, the internal heat of the SSD 10 is directed toward the casing 21. Then, it is suppressed that one of the flash memories 11 and the controller 12 heats the other and that temperature rises in the flash memories 11 and the controller 12.

For example, the positions of the controller 12 and the flash memories 11 may be changed due to a design change of the SSD 10. In the case where the controller is thermally connected to the casing simply by grease or gel, the design of the casing may be changed according to the change in positions of the controller and the flash memories. In this embodiment, however, the first wall 24 connects thermally the first substrate 22 to the casing 21, which eliminates the need for design change of the casing 21. Then, it is suppressed that development costs and lengthening of development period of the SSD 10 increase due to design change of the SSD 10.

The controller 12 generates a larger amount of heat than that of each of the flash memories 11. Accordingly, the heat tends to be conducted from the region on which the controller 12 is arranged generating a larger amount of heat to the region on which the flash memories 11 are arranged. However, the heat transferred from the controller 12 to the first substrate 22 is conducted by the first wall 24 to the casing 21 before being transferred to the flash memories 11. Then, it is suppressed that the controller 12 heats the flash memories 11 and that a temperature rise in the flash memories 11.

The first wall 24 is extended in the direction (along the X axis) crossing the direction from the flash memories 11 toward the controller 12 (along the Y axis). In other words, the first wall 24 is extended so as to traverse the path of thermal conduction from the flash memories 11 to the controller 12. Accordingly, the heat conducted from one of the flash memories 11 and the controller 12 to the other via the first substrate 22 can be conducted more reliably from the first wall 24 to the casing 21. Then, it is suppressed that temperature rises in the flash memories 11 and the controller 12.

The first wall 24 is brought into contact elastically with the casing 21. This allows the first wall 24 to connect thermally the first substrate 22 to the casing 21 in a more reliable manner. In addition, when the first wall 24 deforms elastically, the force from the first wall 24 acting on the first substrate 22 and the casing 21 is decreased. Accordingly, it is suppressed that the first substrate 22 and the casing 21 are damaged by the first wall 24. Further, weakening of thermal connection between the first substrate 22 and the casing 21 due to aging degradation is suppressed as compared to the case where the first substrate 22 is thermally connected to the casing 21 by grease or gel, for example. Furthermore, the dimension accuracy required for manufacture of the SSD 10 is reduced as compared to the case where the first wall 24 is attached to the casing 21, for example.

The first wall 24 has the second extended portion 52 extended in the direction along the Y axis. In other words, the second extended portion 52 is extended along the first covering wall 31 of the casing 21. Accordingly, the contact area between the first wall 24 and the casing 21 tends to be larger to conduct from the first wall 24 to the casing 21 in a more reliable manner.

The third wall 26 connecting thermally the first substrate 22 to the casing 21 is attached to the first mounting face 22a of the first substrate 22 between the DRAM 13 and the controller 12. Accordingly, the heat transferred from one of the DRAM 13 and the controller 12 to the first substrate 22 is conducted by the third wall 26 to the casing 21 before being transferred to the other. Then, it is suppressed that one of the DRAM 13 and the controller 12 heats the other, and that temperature rises in each of the DRAM 13 and the controller 12.

The first wall 24 is thermally connected to the first land 45 provided on the first mounting face 22a. Accordingly, the heat is more likely to be transferred from the first substrate 22 to the first wall 24 as compared to the case where the first wall 24 is thermally connected to the insulation layer provided on the first mounting face 22a, for example. Accordingly, the heat in the first substrate 22 is conducted more efficiently by the first wall 24 to the casing 21. Then, it is suppressed that temperature rises in each of the flash memories 11 and the controller 12.

The first substrate 22 has the ground layer 41 thermally connected to the controller 12 and the first land 45. Accordingly, the heat in the controller 12 is more likely to be conducted to the ground layer 41, and the heat in the ground layer 41 is more likely to be conducted from the first land 45 to the first wall 24. Therefore, the heat in the controller 12 is conducted more efficiently by the first wall 24 to the casing 21. Then, it is suppressed that a temperature rise in the controller 12. The heat in the controller 12 is conducted via not only the ground layer 41 but also various portions such as the conductor layer, the insulation layer, and the wiring pattern of the first substrate 22.

The first wall 24 is soldered to the first land 45. Accordingly, the first wall 24 is attached more easily to the first mounting face 22a, and the heat in the first substrate 22 is more likely to be conducted to the first wall 24. Therefore, the heat in the controller 12 is transferred more efficiently by the first wall 24 to the casing 21. Then, it is suppressed that a temperature rise in the controller 12.

The first wall 24 is provided with the plurality of holes 55. Accordingly, it is suppressed that weight of the SSD 10 is increased due to the provision of the first wall 24. In addition, in the case where the Inside of the casing 21 is air-coolable, the air can pass through the holes 55. Then, it is suppressed that the first wall 24 interferes with the air-cooling of the flash memories 11 and the controller 12.

The first wall 24 is provided with the cutout 57, the electronic component 61 and the wires 62 configured to be passed through the cutout 57. Accordingly, when the electronic component 61 and the wires 62 are located between the flash memories 11 and the controller 12, the first wall 24 can be provided between the flash memories 11 and the controller 12.

The first wall 24 is provided at a position except a position between the controller 12 and the first end portion 22c of the first substrate 22 in the direction along the Y axis, a position between the controller 12 and the third end portion 22e in the direction along the X axis, and a position between the controller 12 and the fourth end portion 22f in the direction along the X axis. Accordingly, it is possible to provide easily various elements such as wires and electronic components between the controller 12 and the third end portion 22e of the first substrate 22, for example.

Second Embodiment

A second embodiment will be described below with reference to FIGS. 6 and 7. In the following descriptions of the plurality of embodiments, the constituent elements with the same functions as those of the constituent elements already described above will be given the same reference signs as those of the constituent elements already described above, and thus descriptions thereof may be omitted. The plurality of constituent elements with the same reference signs may not have all functions and properties in common but may have different functions and properties according to the embodiments.

Figure 6:
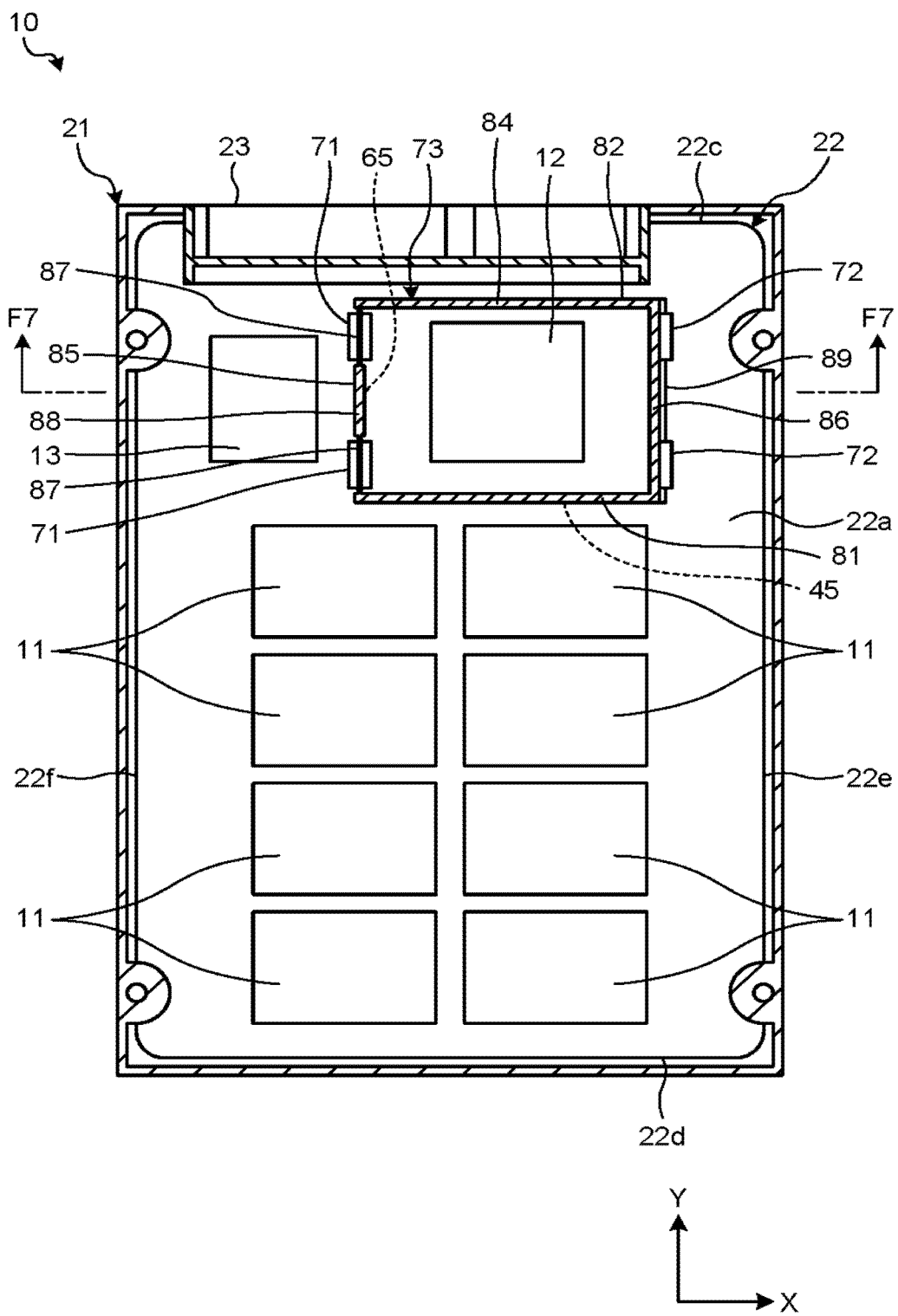
FIG. 6 is a cross-sectional view showing an SSD according to a second embodiment.

FIG. 6 is a cross-sectional view showing an SSD 10 according to the second embodiment. FIG. 7 is a cross-sectional view showing the SSD 10 in the second embodiment taken along line F7-F7 illustrated in FIG. 6. As illustrated in FIGS. 6 and 7, the SSD 10 in the second embodiment has two clips 71, two lock units 72, a shield case 73, a first heat transfer sheet 74, and a second heat transfer sheet 75.

Each of the clips 71 is an example of attachment unit, and may be also called lock portion, fixing portion, fastening portion, or portion, for example. The shield case 73 is an example of a first member, and may be also called housing, covering portion, protection portion, wall, or component, for example. The first heat transfer sheet 74 is an example of a first heat conducting member. The second heat transfer sheet 75 is an example of a second heat conducting member.

Figure 7:
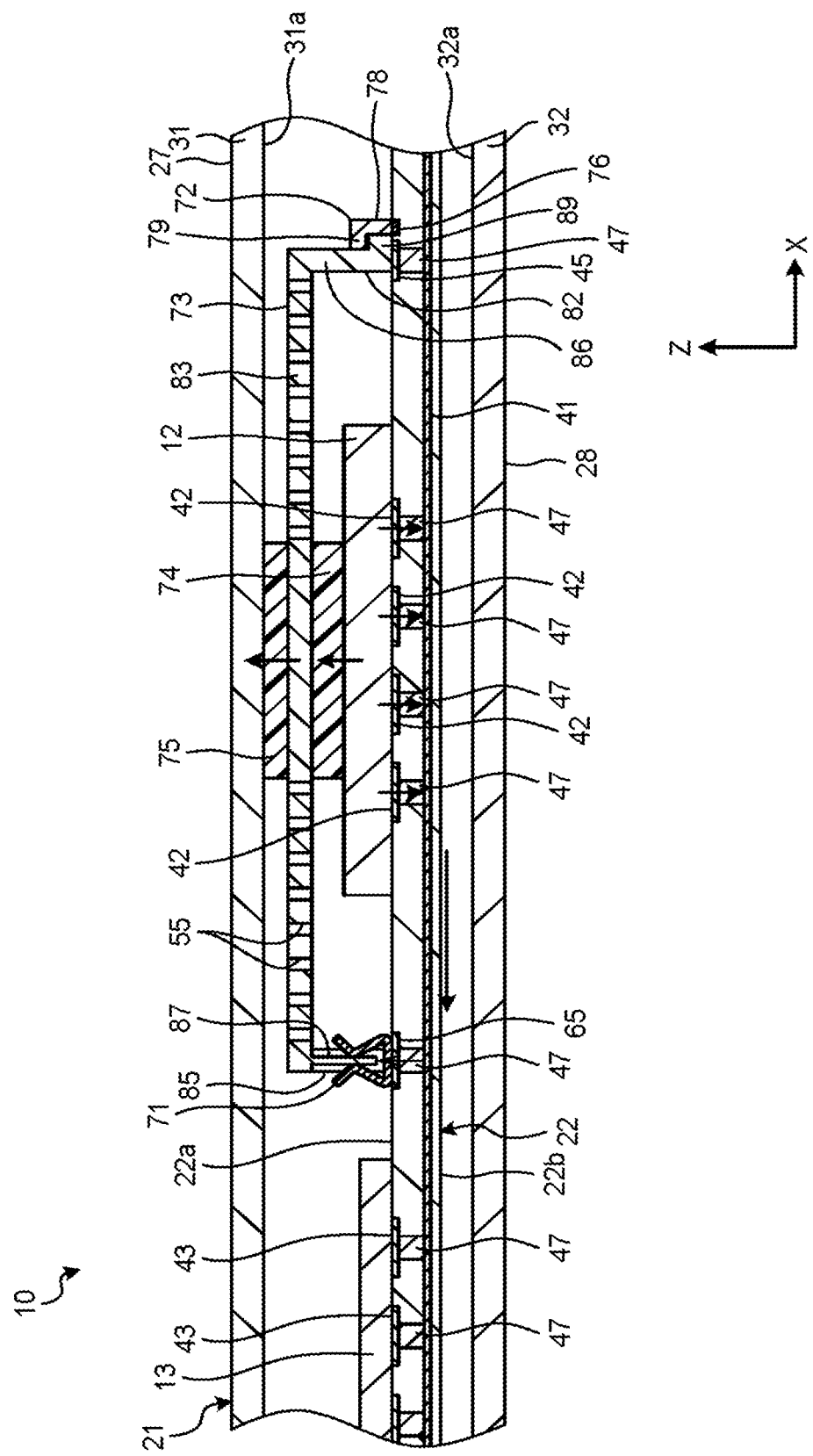
FIG. 7 is a cross-sectional view snowing the SSD in the second embodiment taken along line F7-F7 illustrated in FIG. 6.

As illustrated in FIG. 7, the clips 71 are attached to the third land 65 between the controller 12 and the DRAM 13, by soldering, for example. In other words, the clips 71 are attached to the first mounting face 22a of the first substrate 22 between the controller 12 and the DRAM 13. The clips 71 may also be attached to the first mounting face 22a by an adhesive, for example.

The clips 71 can clip a member extending in the direction along the Y axis to detachably attach to the first substrate 22, for example. The two clips 71 are arranged in the direction along the Y axis.

The lock units 72 are fixed to the first mounting face 22a of the first substrate 22. For example, the lock units 72 are fixed by soldering to a fixation land 76 provided on the first mounting face 22a. The controller 12 is positioned between the clips 71 and the lock units 72, for example. The two lock units 72 are arranged in the direction along the Y axis. However, the positions of the clips 71 and the lock units 72 are not limited to the foregoing ones.

Each of the lock units 72 has a protrusion 78 and an extension 79. The protrusion 78 is projected from the first mounting face 22a in the direction along the Z axis. The extension 79 is extended from the distal end portion of the protrusion 78 in the direction toward the controller 12.

The shield case 73 is made of metal. The shield case 73 is formed in a significantly cuboidal box shape opened at the bottom side. The shield case 73 may be made of another material or formed in another shape. The shield case 73 has a first wall portion 81, a second wall portion 82, and a third wall portion 83.

As illustrated in FIG. 6, the first wall portion 81 is formed in a significantly rectangular plate shape extended in the direction along the X axis. In other words, the first wall portion 81 extended in the direction (along the X axis) crossing the direction (along the Y axis) from the flash memories 11 toward the controller 12. The first wall portion 81 is positioned between the flash memories 11 and the controller 12.

The second wall portion 82 has a first peripheral wall portion 84, a second peripheral wall portion 85, and a third peripheral wall portion 86. The first peripheral wall portion 84 is formed in a significantly rectangular plate shape extended in the direction along the X axis. The controller 12 is positioned between the first wall portion 81 and the first peripheral wall portion 84. Each of the second peripheral wall portion 85 and the third peripheral wall portion 86 is formed in a significantly rectangular plate shape extended in the direction along the Y axis. The controller 12 is positioned between the second peripheral wall portion 85 and the third peripheral wall portion 86.

The ends of the first peripheral wall portion 84 are connected to one end of the second peripheral wall portion 85 and one end of the third peripheral wall portion 86. The other end of the second peripheral wall portion 85 and the other end of the third peripheral wall portion 86 are connected to the ends of the first wall portion 81. The second wall portion 82 surrounds the controller 12 together with the first wall portion 81.

The second peripheral wall portion 85 has two thin portions 87 and a thick portion 88. Each of the thin portions 87 is an example of a first portion and may be also called attached portions, for example. The thick portion 88 is an example of a second portion and may be also called contact portion, for example.

The two thin portions 87 are positioned in correspondence with the two clips 71. When the thin portions 87 are secured with the clips 71, the second peripheral wall portion 85 is detachably attached by the clips 71 to the first mounting face 22a of the first substrate 22. In other words, the clips 71 are configured to be capable of detaching the second peripheral wall portion 85 of the shield case 73 from the first substrate 22.

The thick portion 88 is thicker than each of the thin portions 87. Specifically, the portions (the thin portions 87) of the second peripheral wall portion 85 attached to the clips 71 are made thinner than the other portion (thick portion 88). The thickness of the thick portion 88 is substantially the same as each of that of the first wall portion 81, that of the other portions of the second wall portion 82, and that of the third wall portion 83. The thickness of the thick portion 88 is not limited to this.

The clips 71 are positioned between the controller 12 and the DRAM 13. Accordingly, the second peripheral wall portion 85 attached by the clips 71 to the first mounting face 22a of the first substrate 22 is positioned between the controller 12 and the DRAM 13.

A projection 89 is projected from the third peripheral wall portion 86. The projection 89 is provided in a position corresponding to the lock units 72. The projection 89 extended along the Y axis, for example, but is not limited to this. The projection 89 can be hooked on the lock units 72.

The third wall portion 83 is connected to the end portion of the first wall portion 81 and the end portion of the second wall portion 82 in the Z direction. As illustrated in FIG. 7, the third wall portion 83 covers the controller 12. The third wall portion 83 is positioned between the controller 12 and the first covering wall 31 of the casing 21. The third wall portion 83 is separated from the controller 12 and is also separated from the first covering wall 31.

The shield case 73 is detachably attached to the first mounting face 22a of the first substrate 22. For example, the projection 89 is first hooked on the extensions 79 of the lock units 72. Then, the thin portions 87 of the second peripheral wall portion 85 are secured with the clips 71. Accordingly, the shield case 73 is detachably attached to the first mounting face 22a by the clips 71 and the lock units 72. The shield case 73 is electrically and thermally connected to the third land 65 via the clips 71.

When the shield case 73 is attached to the first mounting face 22a, the first wall portion 81, the first peripheral wall portion 84, the thick portion 88 of the second peripheral wall portion 85, and the third peripheral wall portion 86 may be brought into contact directly or indirectly with the first mounting face 22a. For example, the thick portion 88 of the second peripheral wall portion 85 is brought into contact with the third land 65 provided on the first mounting face 22a via a resin member with thermal conductivity, electrical conductivity, and elasticity, and is electrically and thermally connected to the third land 65. Since the thick portion 88 contacts the third land 65 via the resin member, the thick portion 88 can be brought into indirect contact with the third land 65 even if the thick portion 88 has variations in dimensions in the direction along the Z axis. The first wall portion 81 is brought into contact with the first land 45 provided on the first mounting face 22a and is electrically and thermally connected to the first land 45. The shield case 73 may be attached to the first and third lands 45 and 65 by soldering.

As illustrated in FIG. 7, the first land 45 in this embodiment is provided not only between the flash memories 11 and the controller 12 but also between the controller 12 and the third end portion 22e of the first substrate 22. Accordingly, the third peripheral wall portion 86 of the second wall portion 82 also is brought into contact with the first land 45 and is electrically and thermally connected to the first land 45.

The first heat transfer sheet 74 intervenes between the controller 12 and the third wall portion 83 of the shield case 73. The first heat transfer sheet 74 connects thermally the controller 12 to the shield case 73.

The first heat transfer sheet 74 is a graphite sheet, for example, but may be any other member. The first heat transfer sheet 74 is softer than the shield case 73. In other words, the first heat transfer sheet 74 is more prone to elastically deform than the shield case 73. Accordingly, the first heat transfer sheet 74 is brought into contact elastically with the controller 12 and also brought into contact elastically with the shield case 73.

The second heat transfer sheet 75 intervenes between the third wall portion 83 of the shield case 73 and the first covering wall 31 of the casing 21. The second heat transfer sheet 75 connects thermally the shield case 73 to the casing 21.

The second heat transfer sheet 75 is a graphite sheet, for example, but may be any other member. The second heat transfer sheet 75 is softer than the shield case 73. In other words, the second heat transfer sheet 75 is more prone to elastically deform than the shield case 73. Accordingly, the second heat transfer sheet 75 is brought into contact elastically with the shield case 73 and also brought into contact elastically with the first covering wall 31.

The third wall portion 83 is provided with a plurality of holes 55. The plurality of holes 55 may be also provided in the first wall portion 81 and the second wall portion 82. The portion of the third wall portion 83 brought into contact with the first heat transfer sheet 74 and the portion of the third wall portion 83 brought into contact with the second heat transfer sheet 75 are formed substantially flat without the holes 55.

When the power circuit 14 supplies an internal direct-current power-supply voltage to the controller 12, the SSD 10 is activated. With the activation of the SSD 10, the flash memories 11, the controller 12, and the DRAM 13 generate heat.

As illustrated by arrows in FIG. 7, the heat generated by the controller 12 is conducted from the plurality of first pads 42 to the ground layer 41 via the vias 47. The heat in the ground layer 41 is directed from the region on which the controller 12 is arranged to the region on which the flash memories 11 are arranged.

The first wall portion 81 of the shield case 73 is provided between the controller 12 and the flash memories 11. Accordingly, the heat in the ground layer 41 is conducted to the shield case 73 via the vias 47 and the first land 45 before reaching the region on which the flash memories 11 are arranged.

Similarly, the second peripheral wall portion 85 of the second wall portion 82 of the shield case 73 is provided between the controller 12 and the DRAM 13. Accordingly, the heat of the ground layer 41 is conducted to the shield case 73 via the vias 47 and the third land 65 before reaching the region on which the DRAM 13 is arranged.

Further, the first heat transfer sheet 74 connects thermally the controller 12 to the third wall portion 83 of the shield case 73. Accordingly, the heat in the controller 12 is conducted to the shield case 73 via the first heat transfer sheet 74.

The shield case 73 is thermally connected by the second heat transfer sheet 75 to the first covering wall 31 of the casing 21. Accordingly, the heat conducted to the shield case 73 is then conducted to the first covering wall 31. The heat in the first covering wall 31 is discharged to the outside of the SSD 10.

As described above, the heat in the controller 12 is discharged from the casing 21 to the outside of the SSD 10 by the shield case 73, the first heat transfer sheet 74 and the second heat transfer sheet 75. Then, the heat transferred from the controller 12 generating a relatively large amount of heat to the flash memories 11 and the DRAM 13 is reduced.

In the SSD 10 of the second embodiment, the clips 71 detachably attach the shield case 73 to the first substrate 22, the clips 71 attached to the first mounting face 22a. Accordingly, in the case of repairing or inspecting the first substrate 22, for example, the shield case 73 can be easily removed from the first substrate 22.

The thick portion 88 brought into contact with the first mounting face 22a is thicker than the thin portions 87 secured with the clips 71. The thinness of the thin portions 87 allows the clips 71 to be small-sized, thereby resulting in downsizing of the SSD 10. Further, the thickness of the thick portion 88 makes the heat from the first substrate 22 more prone to be conducted to the shield case 73. It is suppressed that one of the flash memories 11 and the controller 12 heats the other, and that temperature rises in the flash memories 11 and the controller 12.

The shield case 73 has the first wall portion 81 configured to be positioned between the flash memories 11 and the controller 12, the second wall portion 82 surrounding the controller 12 together with the first wall portion 81, and the third wall portion 83 covering the controller 12. Accordingly, the heat in one of the flash memories 11 and the controller 12 is conducted by the shield case 73 to the casing 21 before being transferred to the other via the air in the casing 21, for example. Then, it is suppressed that one of the flash memories 11 and the controller 12 heats the other, and that temperature rises in the flash memories 11 and the controller 12. When the shield case 73 is provided without the holes 55, the shield case 73 surrounds the controller 12 so that the controller 12 is shielded electromagnetically.

The first heat transfer sheet 74 more prone to elastically deform than the shield case 73 connects thermally the controller 12 to the shield case 73. Accordingly, the heat in the controller 12 is conducted to the casing 21 via the first heat transfer sheet 74 and the shield case 73. Then, it is suppressed that the controller 12 heats the flash memories 11, and that a temperature rises in the flash memories 11.

The second heat transfer sheet 75 more prone to elastically deform than the shield case 73 connects thermally the shield case 73 to the casing 21. Accordingly, the heat in the controller 12 is conducted to the casing 21 via the first heat transfer sheet 74, the shield case 73, and the second heat transfer sheet 75. Then, it is suppressed that the controller 12 heats the flash memories 11, and that a temperature rises in the flash memories 11.

Third Embodiment

Figure 8:
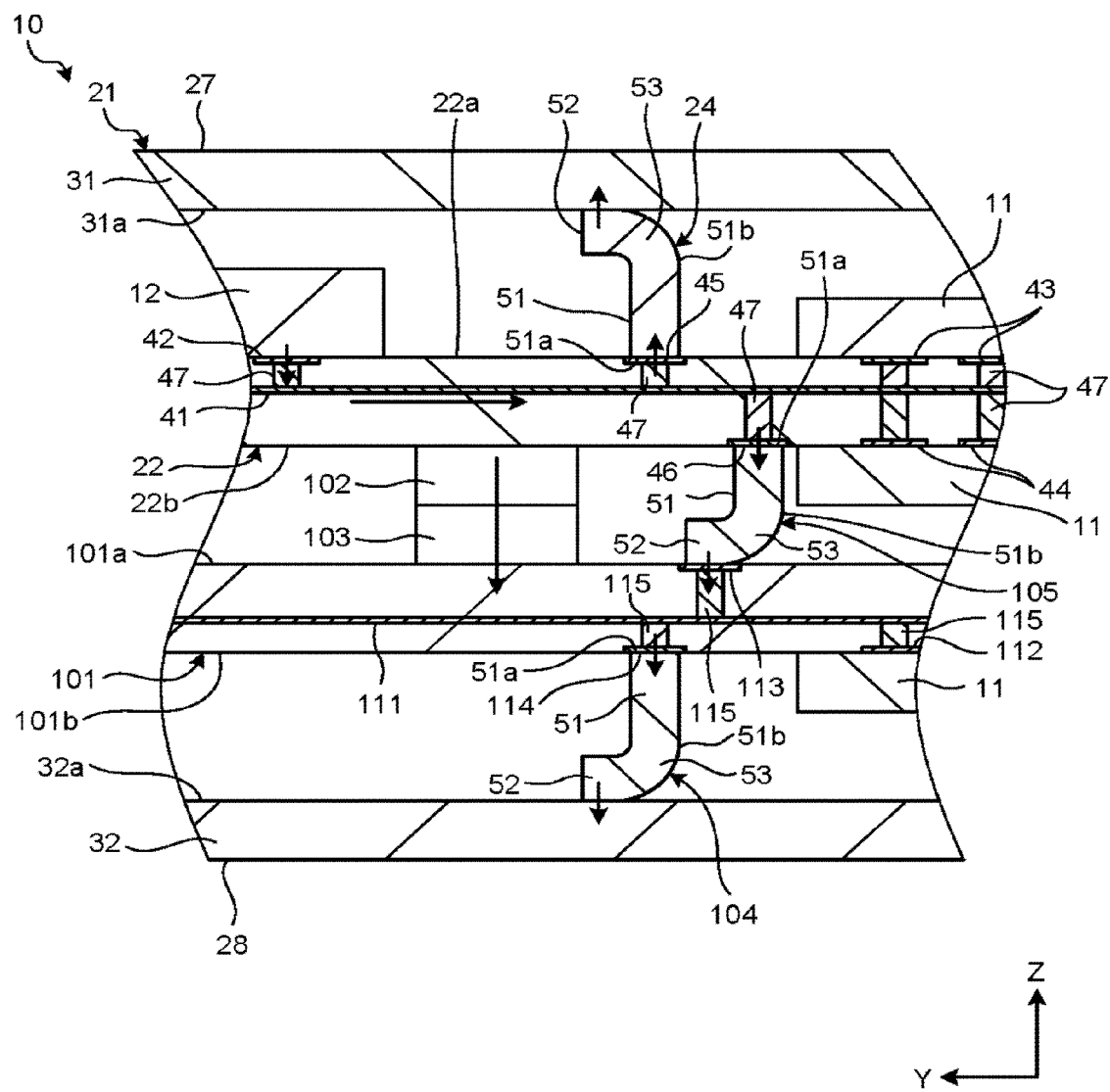
FIG. 8 is a cross-sectional view showing a portion of an SSD according to a third embodiment.

A third embodiment will be described below with reference to FIG. 8. FIG. 8 is a cross-sectional view showing a portion of an SSD 10 according to the third embodiment. As illustrated in FIG. 8, the SSD 10 in the third embodiment has a second substrate 101, a first connector 102, a second connector 103, a fourth wall 104, and a fifth wall 105. The fourth wall 104 is an example of a third member. The fifth wall 105 is an example of a fourth member.

The second substrate 101 is a multi-layered PCB having a plurality of conductor layers and a plurality of insulation layers, for example. The second substrate 101 may be another substrate. The second substrate 101 overlaps the first substrate 22 in the direction along the Z axis and is housed in the casing 21. The second substrate 101 is positioned between the first substrate 22 and the second cover 28.

The second substrate 101 has a third mounting face 101a and a fourth mounting face 101b. The third mounting face 101a is an example of a third face and is formed substantially flat. The fourth mounting face 101b is an example of a fourth face and is formed substantially flat. The fourth mounting face 101b is positioned on the side opposite to the third mounting face 101a.

The third mounting face 101a of the second substrate 101 is opposed to the second mounting face 22b of the first substrate 22. The third mounting face 101a is positioned at a position separated from the second mounting face 22b of the first substrate 22.

The fourth mounting face 101b of the second substrate 101 is opposed to the second inner face 32a of the second covering wall 32. The fourth mounting face 101b is arranged at a position separated from the second inner face 32a of the second covering wall 32. The fourth mounting face 101b may be in partial contact with the second inner face 32a.

The second substrate 101 has a ground layer 111, a plurality of third pads 112, a fourth land 113, a fifth land 114, and a plurality of vias 115.

The ground layer 111 is a metal layer provided inside the second substrate 101. The third pads 112 are conductors exposed on the fourth mounting face 101b. The fourth land 113 is a conductor exposed on the third mounting face 101a. The fifth land 114 is a conductor exposed on the fourth mounting face 101b.

The terminals of the flash memories 11 are electrically connected to the third pad 112 by soldering, for example. Accordingly, the plurality of flash memories 11 is mounted on the fourth mounting face 101b of the second substrate 101. The flash memories 11 may be mounted on the third mounting face 101a, or may be mounted on both of the third and fourth mounting faces 101a and 101b. Each of the flash memories 11 mounted on the third mounting face 101a or the fourth mounting face 101b of the second substrate 101 is an example of a second volatile memory. Further, the second connector 103 is mounted on the third mounting face 101a.

The vias 115 are provided inside the second substrate 101. The plurality of vias 115 connects electrically the ground layer 111 and the plurality of third pads 112. The plurality of vias 115 also connects electrically the ground layer 111 and the fourth land 113, and connects electrically the ground layer 111 and the fifth land 114.

The vias 115 are made of metal. Accordingly, the plurality of vias 115 also connects thermally the ground layer 111 and the plurality of third pads 112. The plurality of vias 115 also connects thermally the ground layer 111 and the fourth land 113, and connects thermally the ground layer 111 and the fifth land 114. Therefore, the third pads 112 are electrically and thermally connected to the fourth land 113, and are also electrically and thermally connected to the fifth lands 114, via the ground layer 111 and the vias 115.

The wiring pattern on the second substrate 101 is not limited to the foregoing pattern with the ground layer 111, the third pads 112, the fourth land 113, the fifth land 114, and the vias 115, but various wiring patterns may be provided on the second substrate 101. By the wiring pattern, the plurality of flash memories 11 and the second connector 103 are electrically and thermally connected to each other.

The first connector 102 is mounted on the second mounting face 22b of the first substrate 22. The first connector 102 is positioned between the flash memories 11 and the controller 12, and is positioned between the controller 12 and the first lands 45, in a plane view of the first substrate 22.

The second connector 103 is mounted on the third mounting face 101a of the second substrate 101 as described above. The fourth land 113 is provided between the second connector 103 and the plurality of flash memories 11. The fifth land 114 is provided between the second connector 103 and the plurality of flash memories 11.

The second connector 103 is connected to the first connector 102. Accordingly, the first substrate 22 is connected to the second substrate 101 via the first and second connectors 102 and 103. The controller 12 controls not only the flash memories 11 mounted on the first substrate 22 but also the flash memories 11 mounted on the second substrate 101.

The fourth wall 104 is almost the same member as each of the first to third walls 24 to 26. The dimension of each of the sections of the fourth wall 104 may be different from the corresponding dimension of the first to third walls 24 to 26.

The fourth wall 104 is attached to the fourth mounting face 101b of the second substrate 101. The fourth wall 104 is made of metal. The fourth wall 104 may be made from another material. The fourth wall 104 made from another material is attached to the fourth mounting face 101b by a means such as a thermal conductive adhesive or another adhesive, for example. The thermal conductivity of the fourth wall 104 is higher than the thermal conductivity of the insulation layer of the second substrate 101, for example.

The fourth wall 104 is extended in the direction along the X axis. In other words, the fourth wall 104 is extended in the direction (along the X axis) crossing the direction (along the Y axis) from the flash memories 11 toward the second connector 103.

The fourth wall 104 has a first extended portion 51, a second extended portion 52, and a curved portion 53, as each of the first to third walls 24 to 26. The fourth wall 104 is further provided with a plurality of holes 55 and a cutout 57.

A first end portion 51a of the first extended portion 51 of the fourth wall 104 is attached to the fifth land 114 provided on the fourth mounting face 101b by soldering. In other words, the first extended portion 51 of the fourth wall 104 is attached to the fourth mounting face 101b.

By soldering the first extended portion 51 to the fifth land 114, the fourth wall 104 is electrically and thermally connected to the fifth land 114. Accordingly, the fourth wall 104 is electrically and thermally connected to the flash memories 11 via the fifth land 114, the vias 115, the ground layer 111, and the third pads 112.

At least one of the second extended portion 52 and the curved portion 53 of the fourth wall 104 is brought into elastically contact with the second inner face 32a of the second covering wall 32 of the casing 21. When the curved portion 53 is deformed elastically, at least one of the second extended portion 52 and the curved portion 53 is pressed against the second inner face 32a.

When the fourth wall 104 is brought into contact with the second inner face 32a, the fourth wall 104 is thermally connected to the second covering wall 32 of the casing 21. Accordingly, the fourth wall 104 attached to the second substrate 101 connects thermally the second substrate 101 to the casing 21.

The fifth land 114 is positioned between the flash memories 11 and the second connector 103. Accordingly, the fourth wall 104 attached to the fifth land 114 is also positioned between the flash memories 11 and the second connector 103. In other words, the fourth wall 104 is positioned between the flash memories 11 and the second connector 103 in a plane view of the first substrate 22.

The fifth wall 105 is almost the same member as each of the first to fourth walls 24, 25, 26, and 104. The dimension of each of the sections of the fifth wall 105 may be different from the corresponding dimension of the first to fourth walls 24, 25, 26, and 104.

The fifth wall 105 is attached to the second mounting face 22b of the first substrate 22 instead of the second wall 25 in the first embodiment. The fifth wall 105 is made of metal. The fifth wall 105 may be made of another material. The fifth wall 105 made of another material is attached to the second mounting face 22b by a means such as a thermal conductive adhesive or another adhesive, for example. The thermal conductivity of the fifth wall 105 is higher than the thermal conductivity of the insulation layer of the first substrate 22, for example.

The fifth wall 105 is extended in the direction along the X axis. In other words, the fifth wall 105 is extended in the direction (along the X axis) crossing the direction (along the Y axis) from the flash memories 11 toward the controller 12.

The fifth wall 105 has a first extended portion 51, a second extended portion 52, and a curved portion 53 as each of the first to fourth walls 24, 25, 26, and 104. The fifth wall 105 is further provided with a plurality of holes 55 and a cutout 57.

A first end portion 51a of the first extended portion 51 of the fifth wall 105 is attached to the second land 46 provided on the second mounting face 22b by soldering. In other words, the first extended portion 51 of the fifth wall 105 is attached to the second mounting face 22b.

By soldering the first extended portion 51 to the second land 46, the fifth wall 105 is electrically and thermally connected to the second land 46. Accordingly, the fifth wall 105 is electrically and thermally connected to the controller 12 via the second land 46, the vias 47, the ground layer 41, and the first pads 42.

At least one of the second extended portion 52 and the curved portion 53 of the fifth wall 105 is brought into contact elastically with the fourth land 113 provided on the third mounting face 101a of the second substrate 101. When the curved portion 53 is elastically deformed, at least one of the second extended portion 52 and the curved portion 53 is pressed against the fourth land 113.

When the fifth wall 105 is brought into contact with the fourth land 113, the fifth wall 105 is thermally connected to the second substrate 101. Accordingly, the fifth wall 105 attached to the first substrate 22 connects thermally the first substrate 22 to the second substrate 101. The fifth wall 105 may be thermally connected to another portion of the second substrate 101.

The second land 46 is positioned between the flash memories 11 and the controller 12. Accordingly, the fifth wall 105 attached to the second land 46 is also positioned between the flash memories 11 and the controller 12. In other words, the fifth wall 105 is positioned between the flash memories 11 and the controller 12 in a plane view of the first substrate 22.

Further, the fourth land 113 is positioned between the flash memories 11 and the second connector 103. Accordingly, the fifth wall 105 in contact with the fourth land 113 is also positioned between the flash memories 11 and the second connector 103. In other words, in a plane view of the fourth mounting face 101b, the fifth wall 105 is arranged between the flash memories 11 and the second connector 103.

Meanwhile, the first land 45 provided on the first mounting face 22a of the first substrate 22 is positioned between the flash memories 11 and the first connector 102. Accordingly, the first wall 24 attached to the first land 45 is also positioned between the flash memories 11 and the first connector 102. In other words, in a plane view of the first mounting face 22a, the first wall 24 is positioned between the flash memories 11 and the first connector 102.

When the power circuit 14 supplies an internal direct-current power-supply voltage to the controller 12, the SSD 10 is activated. With the activation of the SSD 10, each of the flash memories 11, the controller 12 and the DRAM 13 generates heat.

As illustrated by arrows in FIG. 8, the heat generated by the controller 12 is conducted from the plurality of first pads 42 to the ground layer 41 via the vias 47. The heat in the ground layer 41 is directed form the region on which the controller 12 is arranged to the region on which the flash memories 11 is arranged.

As in the first embodiment, the heat in the ground layer 41 is conducted to the first wall 24 via the vias 47 and the first land 45 before reaching the region on which the flash memories 11 is arranged. The heat conducted to the first wall 24 is then conducted to the first covering wall 31. The heat in the first covering wall 31 is discharged to the outside of the SSD 10.

Meanwhile, the first connector 102 is provided between the controller 12 and the flash memories 11. Accordingly, the heat in the ground layer 41 is also conducted to the second substrate 101 via the first and second connectors 102 and 103 before reaching the region on which the flash memories 11 is arranged.

The heat conducted to the second substrate 101 is directed from the region on which the second connector 103 is arranged to the region on which the flash memories 11 is arranged. However, the fourth wall 104 is provided between the flash memories 11 and the second connector 103. Accordingly, the heat in the ground layer 111 is conducted to the fourth wall 104 before reaching the region on which the flash memories 11 is arranged.

The fourth wall 104 connects thermally the second substrate 101 to the second covering wall 32 of the casing 21. Accordingly, the heat conducted to the fourth wall 104 is then conducted to the second covering wall 32. The heat in the second covering wall 32 is discharged to the outside of the SSD 10.

Further, the fifth wall 105 is provided between the first connector 102 and the flash memories 11. Accordingly, the heat in the ground layer 41 of the first substrate 22 is also conducted to the fifth wall 105 before reaching the region on which the flash memories 11 is arranged.

The fifth wall 105 connects thermally the first substrate 22 to the second substrate 101. Accordingly, the heat conducted to the fifth wall 105 is then conducted to the second substrate 101. The heat in the second substrate 101 is discharged to the outside of the SSD 10 via the fourth wall 104 and the second covering wall 32 as described above.

As described above, the heat in the controller 12 is discharged from the casing 21 to the outside of the SSD 10 through the first to fifth walls 24, 25, 26, 104, and 105. Then, the heat transferred from the controller 12 generating a relatively large amount of heat to the flash memories 11 and the DRAM 13 is reduced.

In the SSD 10 of the third embodiment, at least a portion of the first wall 24 is positioned between the first connector 102 and the flash memories 11. Accordingly, the heat conducted from the second substrate 101 to the first substrate 22 via the first and second connectors 102 and 103 is then conducted by the first wall 24 to the casing 21 before being transferred to the flash memories 11. It is suppressed that the second substrate 101 heats the flash memories 11 and that a temperature rises in the flash memories 11.

The first connector 102 is positioned between the flash memories 11 and the controller 12. Accordingly, the heat in the controller 12 is conducted not only from the first substrate 22 to the second substrate 101 via the first and second connectors 102 and 103 but also from the first wall 24 to the casing 21. Thus, the heat conducted from the controller 12 to the second substrate 101 is reduced, and it is suppressed that the second substrate 101 is heated by the controller 12 and that a temperature rises in the second substrate 101.

At least a portion of the fourth wall 104 is positioned between the flash memories 11 mounted on the second substrate 101 and the second connector 103. Accordingly, the heat conducted from the controller 12 of the first substrate 22 to the second substrate 101 via the first and second connectors 102 and 103 is then conducted by the fourth wall 104 to the casing 21 before being transferred to the flash memories 11. It is suppressed that the flash memories 11 mounted on the second substrate 101 is heated by the controller 12 of the first substrate 22 and that a temperature rises in the flash memories 11.

The fifth wall 105 connects thermally the first substrate 22 to the second substrate 101, and at least a portion of the fifth wall 105 is positioned between the flash memories 11 and the controller 12. Accordingly, the heat conducted from one of the flash memories 11 and the controller 12 to the first substrate 22 is then conducted by the fifth wall 105 to the second substrate 101 before being transferred to the other. It is suppressed that one of the flash memories 11 and the controller 12 is heated by the other and that a temperature rises in each of the flash memories 11 and the controller 12.

Fourth Embodiment

Figure 9:
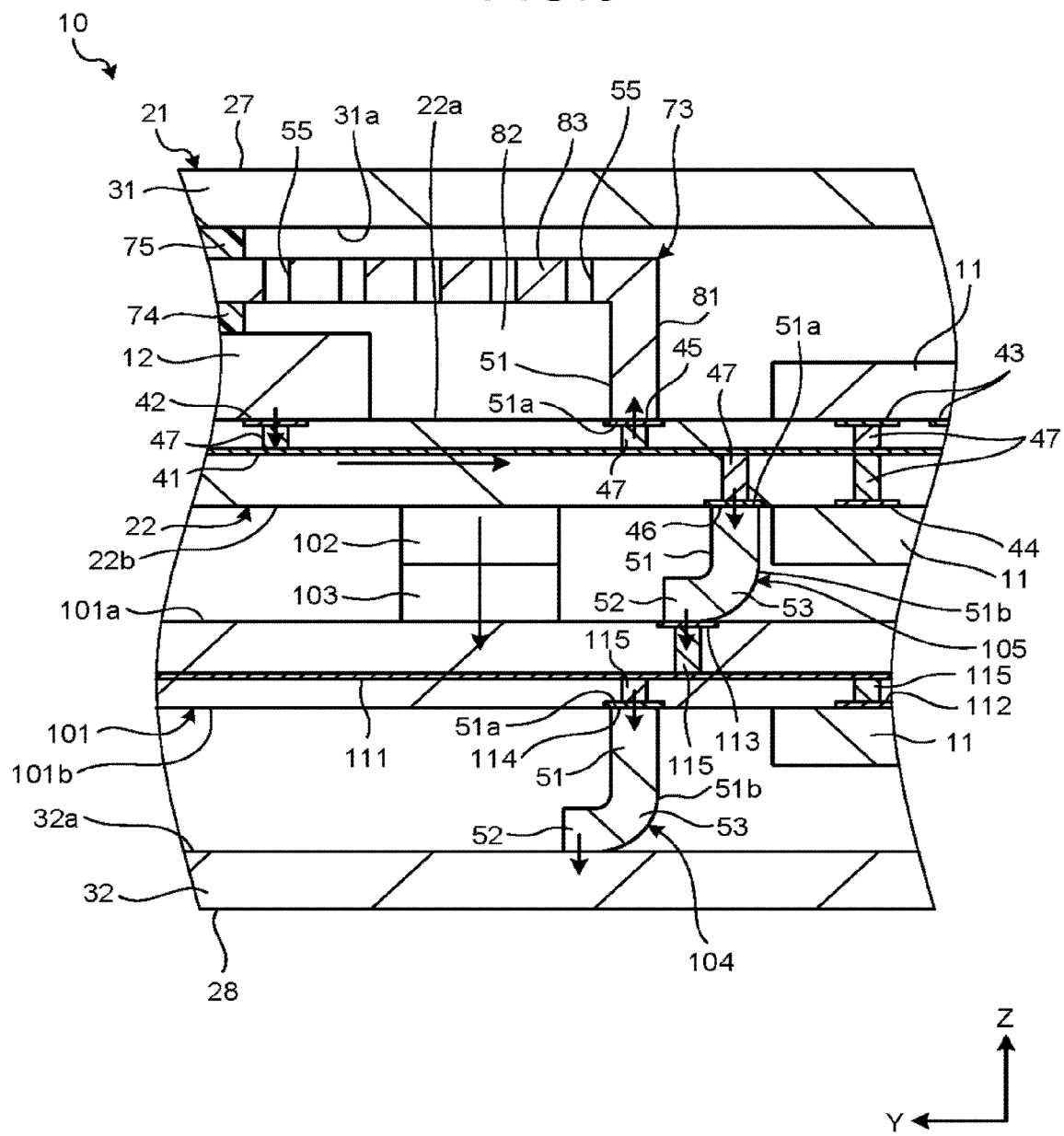
FIG. 9 is a cross-sectional view showing a portion of an SSD according to a fourth embodiment.

A fourth embodiment will be described below with reference to FIG. 9. FIG. 9 is a cross-sectional view showing a portion of an SSD 10 according to the fourth embodiment. As illustrated in FIG. 9, the SSD 10 in the fourth embodiment is almost the same as the SSD 10 in the third embodiment. However, the SSD 10 in the fourth embodiment has the shield case 73 in the second embodiment instead of the first wall 24.

The shield case 73 has the first wall portion 81, the second wall portion 82, and the third wall portion 83 as in the second embodiment. The first wall portion 81 in the fourth embodiment is soldered to the first land 45. However, the first wall portion 81 is not limited to this.

In the SSD 10 of the fourth embodiment, the heat generated by the controller 12 is conducted to the shield case 73 via the first wall portion 81, the second wall portion 82, and the first heat transfer sheet 74. The heat conducted to the shield case 73 is then conducted to the first covering wall 31 via the second heat transfer sheet 75. The heat in the first covering wall 31 is discharged to the outside of the SSD 10.

Fifth Embodiment

Figure 10:
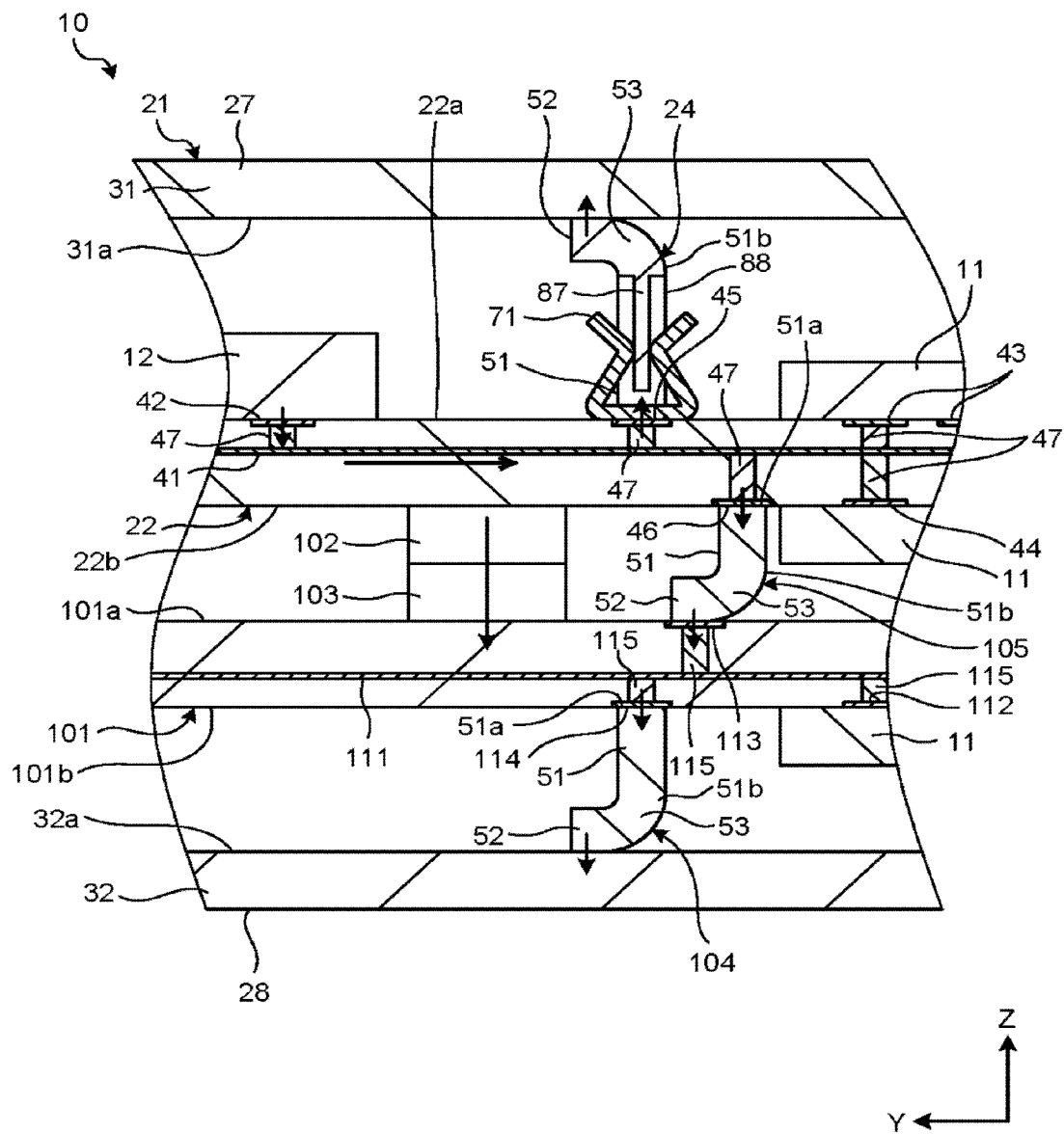
FIG. 10 is a cross-sectional view showing a portion of an SSD according to a fifth embodiment.

A fifth embodiment will be described below with reference to FIG. 10. FIG. 10 is a cross-sectional view showing a portion of an SSD 10 according to the fifth embodiment. As illustrated in FIG. 10, the SSD 10 in the fifth embodiment is almost the same as the SSD 10 in the third embodiment. However, the SSD 10 in the fifth embodiment has further the clips 71 in the second embodiment.

The clips 71 are attached to the first land 45 between the flash memories 11 and the controller 12 by soldering, for example. In other words, the clips 71 are attached to the first mounting face 22a of the first substrate 22 between the flash memories 11 and the controller 12. The clips 71 may be attached to the first mounting face 22a by an adhesive, for example.

Further, the first extended portion 51 of the first wall 24 has the thin portion 87 and the thick portion 38 as the second peripheral wall portion 85 in the second embodiment. When the thin portion 87 is secured with the clips 71, the first wall 24 is detachably attached by the clips 71 to the first mounting face 22a of the first substrate 22. The first wall 24 is electrically and thermally connected to the first land 45 via the clips 71.

When the first wall 24 is attached to the first mounting face 22a, the thick portion 88 of the first wall 24 may be brought into contact directly or indirectly with the first mounting face 22a. For example, the thick portion 88 of the first wall 24 is brought into contact with the first land 45 provided on the first mounting face 22a via a resin member with thermal conductivity, electrical conductivity, and elasticity, and is electrically and thermally connected to the first land 45.

In the SSD 10 of the fifth embodiment, the heat generated by the controller 12 is conducted to the first wall 24. The heat conducted to the first wall 24 is then conducted to the first covering wall 31. The heat in the first covering wall 31 is discharged to the outside of the SSD 10.

Sixth Embodiment

Figure 11:
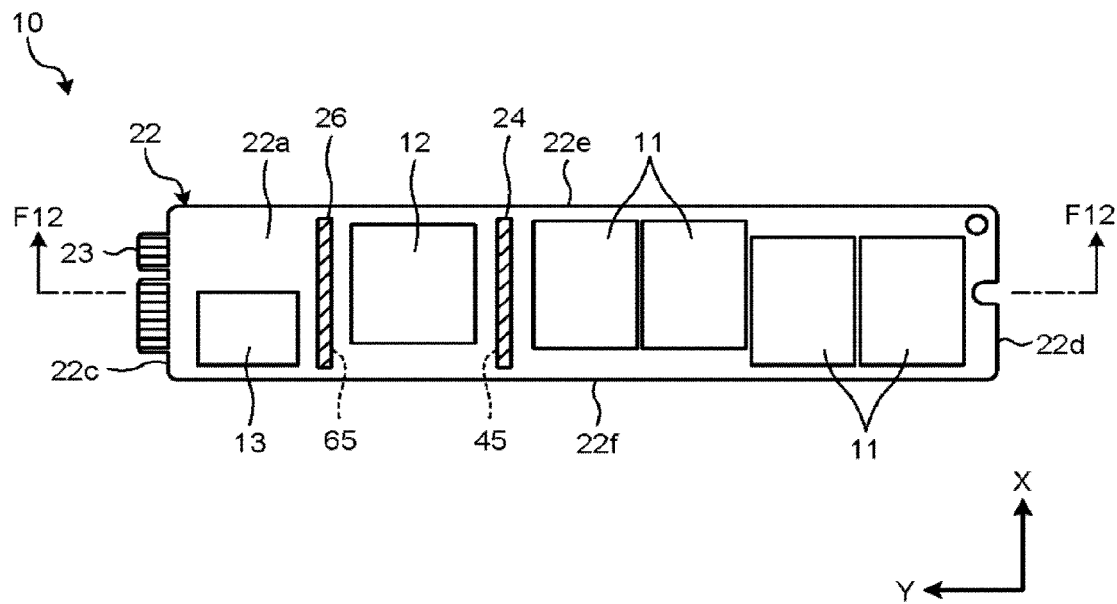
FIG. 11 is a plane view showing an SSD according to a sixth embodiment.
Figure 12:
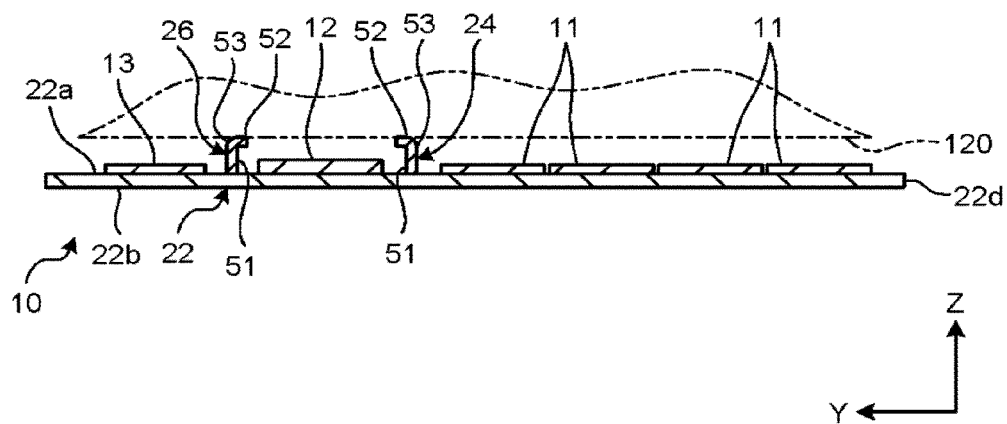
FIG. 12 is a cross-sectional view showing the SSD in the sixth embodiment taken along line F12-F12 illustrated in FIG. 11.

A sixth embodiment will be described below with reference to FIGS. 11 and 12. FIG. 11 is a plane view showing an SSD 10 according to the sixth embodiment. FIG. 12 is a cross-sectional view showing the SSD 10 in the sixth embodiment taken along line F12-F12 illustrated in FIG. 11.

As illustrated in FIG. 11, the SSD 10 in the sixth embodiment is a so-called gum stick-type SSD. The SSD 10 in the sixth embodiment does not have the casing 21, and thus the first substrate 22 is exposed to the outside. The first substrate 22 is extended in the direction along the Y axis.

The controller 12 is positioned between the flash memories 11 and the DRAM 13 in the direction along the Y axis. The first wall 24 is provided between the controller 12 and the flash memories 11 as in the first embodiment. The third wall 26 is provided between the controller 12 and the DRAM 13 as in the first embodiment.

In the direction along the Y axis, the first wall 24 is positioned between the controller 12 and the second end portion 22d of the first substrate 22, and the third wall 26 is positioned between the controller 12 and the first end portion 22c. However, the first wall 24 and the third wall 26 are provided at a position except a position between the controller 12 and the third end portion 22e of the first substrate 22 in the direction along the X axis and a position between the controller 12 and the fourth end portion 22f in the direction along the X axis.

As illustrated in FIG. 12, the first mounting face 22a of the first substrate 22 is opposed to an external member 120. For example, the external member 120 is a casing of a device such as a server, a personal computer, a tablet, a smartphone, or a cellular phone, the SSD 10 installed in the device. However, the external member 120 is not limited to them.

The external member 120 is arranged at a position separated from the first substrate 22. At least one of the second extended portion 52 and the curved portion 53 of the first wall 24 is brought into elastically contact with the external member 120. Similarly, at least one of the second extended portion 52 and the curved portion 53 of the third wall 26 is brought into elastically contact with the external member 120.

When each of the first and third wall 24 and 26 is brought into contact with the external member 120, the first and third walls 24 and 26 are thermally connected to the external member 120. Accordingly, the first and third walls 24 and 26 attached to the first substrate 22 connect thermally the first substrate 22 to the external member 120.

In the SSD 10 of the sixth embodiment, the heat generated by the controller 12 is conducted to the first and third walls 24 and 26. The heat conducted to the first to third walls 24 and 26 are then conducted to the external member 120. Thus, the heat transferred from the controller 12 generating a relatively large amount of heat to the flash memories 11 and the DRAM 13 is reduced.

The first wall 24 is provided at a position except a position between the controller 12 and the third end portion 22e of the first substrate 22 in the direction along the X axis and a position between the controller 12 and the fourth end portion 22f in the direction along the X axis. Accordingly, for example, various elements such as wires and electronic components can be easily provided between the controller 12 and the third and fourth end portions 22e and 22f of the first substrate 22.

The first wall 24 is provided on the first mounting face 22a of the first substrate 22 opposed to the external member 120. Thus, it is suppressed that the external member 120 is brought into contact with the first mounting face 22a.

Figure 13:
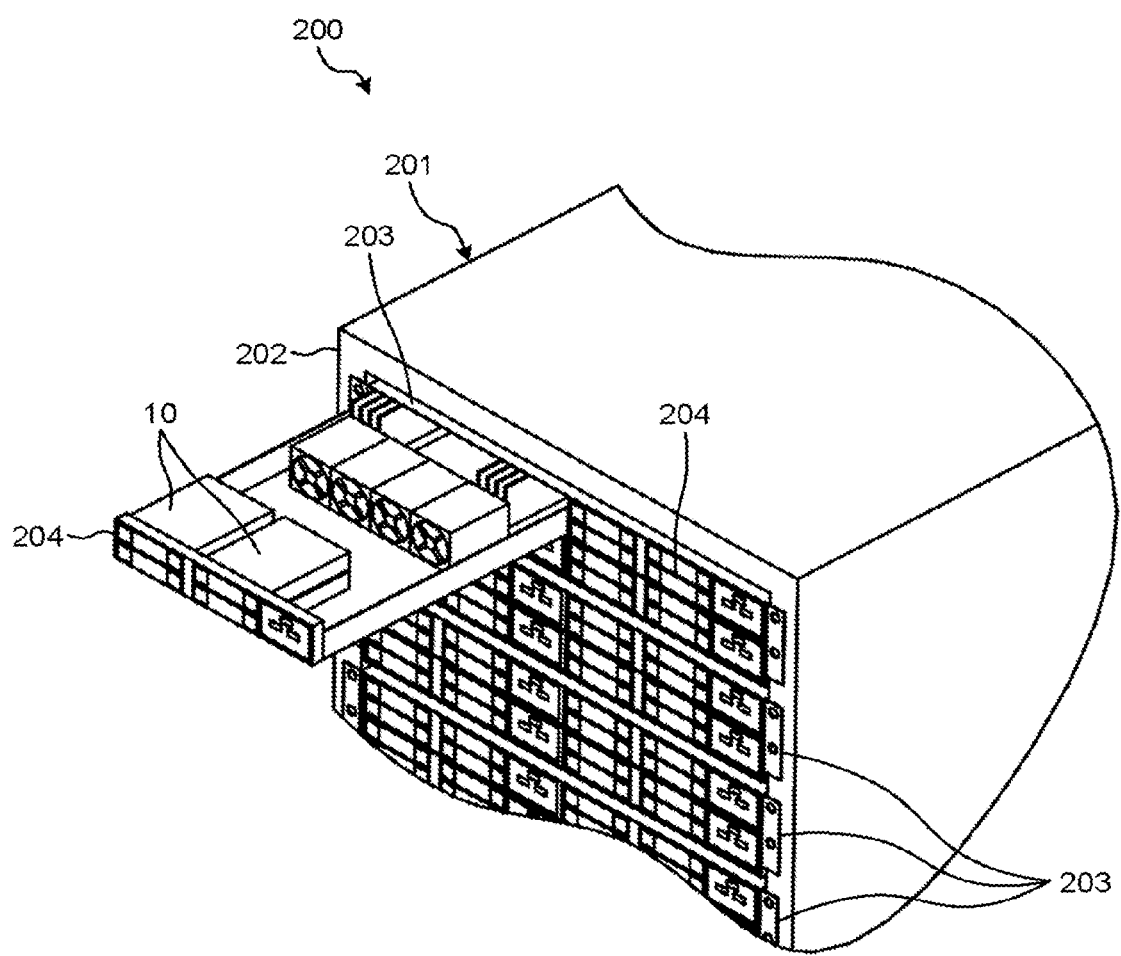
FIG. 13 is a perspective view showing a portion of a data center in which the SSDs according to the first to sixth embodiments are installed.

FIG. 13 is a perspective view showing a portion of a data center 200 in which the SSDs 10 according to the first to sixth embodiments are installed. The data center 200 may be also called server system, storage system, or device. The data center 200 has a plurality of server firms 201, various devices such as a router and a switching hub, and various components such as cables connecting devices. FIG. 13 illustrates one server firm 201.

The server firm 201 has a rack 202, a plurality of module enclosures 203, and a plurality of server modules 204. The plurality of server modules 204 is stored in each of the module enclosures 203. The module enclosures 203 storing the plurality of server modules 204 form a rack-mountable server.

The server modules 204 are inserted into slots of the module enclosures 203. Each of the server modules 204 has a substrate, a CPU, a memory, a fan, and the SSDs 10 in the first to sixth embodiments. The SSDs 10 are stored in drive cages attached to the front panels of the server modules 204, for example.

Figure 14:
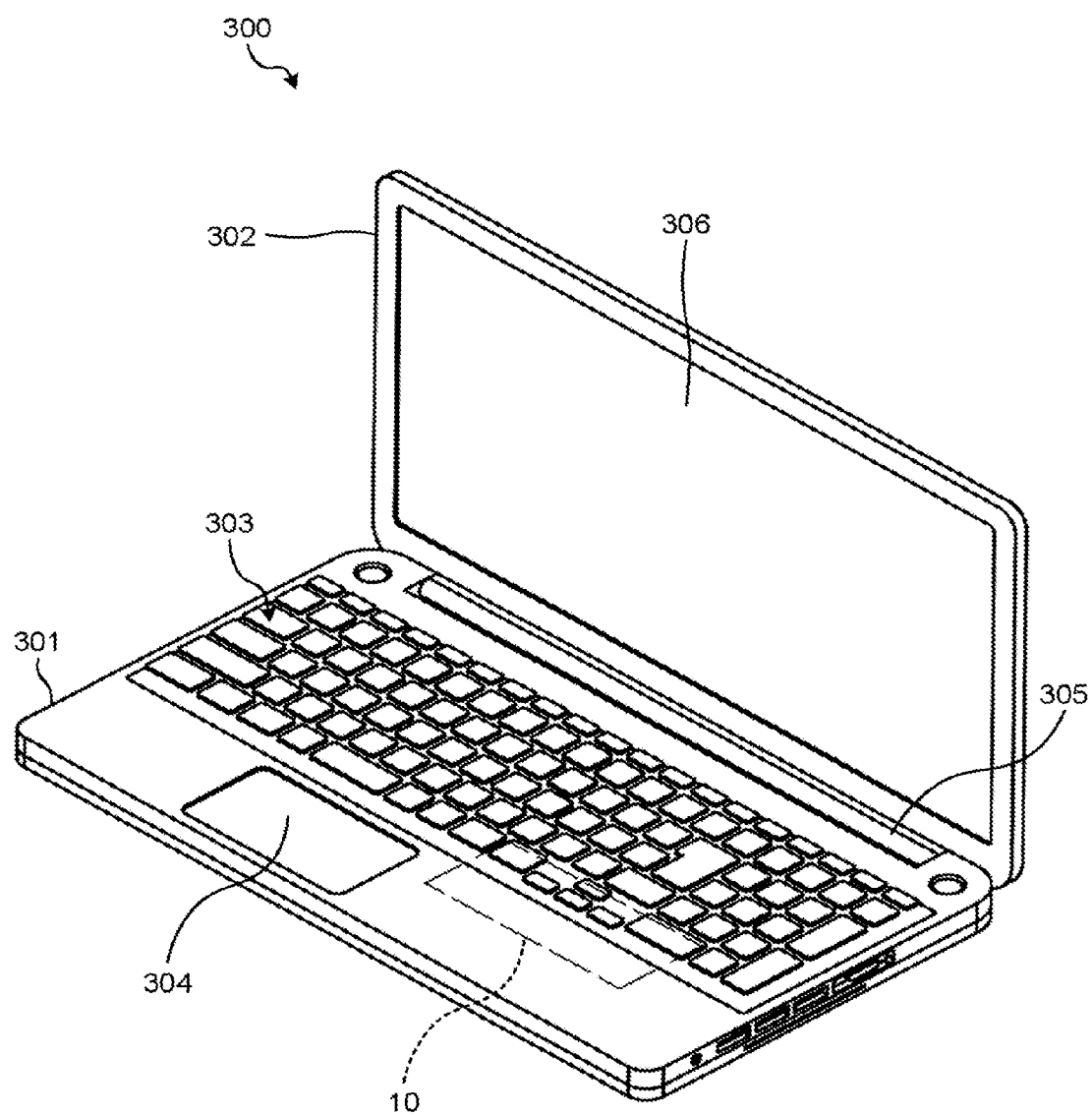
FIG. 14 is a perspective view showing a portable computer in which the SSD according to one of the first to sixth embodiments is installed.

FIG. 14 is a perspective view showing a portable computer 300 in which the SSD 10 according to one of the first to sixth embodiments is installed. The portable computer 300 has a base unit 301 and a display unit 302.

The base unit 301 is formed in a significantly cuboidal shape. The base unit 301 has a mother board, a daughter board, a CPU, a memory, a fan, and the SSD 10 in one of the first to sixth embodiments, for example. Further, the base unit 301 is provided with a keyboard 303 and a touch pad 304.

The display unit 302 is formed in a significantly cuboidal shape. An end portion of the display unit 302 is rotatably connected to an end portion of the base unit 301 by a hinge 305, for example. The display unit 302 has a display module 306, for example. The display module 306 is a liquid crystal display (LCD), for example, and displays an image.

As described above, the SSD 10 is included in various devices, apparatuses, or systems such as the data center 200 and the portable computer 300. The SSD 10 may be partially or entirely modified according to the devices, apparatuses, or systems including the SSD 10.

According to at least one of the embodiments described above, the first member is configured to connect thermally the first substrate and the casing, and at least a portion of the first substrate is positioned between the non-volatile memory and the controller. Thus, temperature rises in the non-volatile memory and the controller is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a first substrate comprising a first face and a second face on the side opposite to the first face;
    a casing housing the first substrate;
    a first non-volatile memory mounted on the first face;
    a controller mounted on the first face or the second face, the controller configured to control the first non-volatile memory; and
    a first member mounted on the first face or the second face, the first member including an elastically deformable part and at least a portion of the first member being positioned between the first non-volatile memory and the controller,
    wherein the first member is configured to be brought into contact with the casing by an elastic deformation of the elastically deformable part to thermally connect the first substrate and the casing.

2. The semiconductor storage device according to claim 1, further comprising an external connector for being connected to an external device, wherein
    the first substrate includes a long side and a short side in a plane view,
    the external connector is provided at the short side of the first substrate, and
    in the plane view of the first substrate, the first member is positioned on the side opposite to the external connector as seen from the position of the controller and is positioned on the same side as the external connector as seen from the first non-volatile memory.

3. The semiconductor storage device according to claim 1, wherein the first member has a wall extended in a direction crossing a direction from the first non-volatile memory toward the controller.

4. The semiconductor storage device according to claim 1, further comprising:
    a volatile memory mounted on the first face or the second face on which the controller is mounted; and
    a second member mounted on the first face or the second face on which the controller is mounted, the second member configured to connect thermally the first substrate and the casing, at least a portion of the second member positioned between the volatile memory and the controller.

5. The semiconductor storage device according to claim 1, further comprising:
    a first connector mounted on the second face;
    a second substrate comprising a third face opposed to the second face and a fourth face on the side opposite to the third face; and
    a second connector mounted on the third face and connected to the first connector, wherein
    the first member is mounted on the first face, and
    at least a portion of the first member is positioned between the first connector and the first non-volatile memory.

6. The semiconductor storage device according to claim 5, wherein the first connector is positioned between the first non-volatile memory and the controller in a plane view of the first substrate.

7. The semiconductor storage device according to claim 6, further comprising:
    a second non-volatile memory mounted on the third face or the fourth face; and
    a third member mounted on the fourth face and configured to connect thermally the second substrate and the casing, at least a portion of the third member positioned between the second non-volatile memory and the second connector.

8. The semiconductor storage device according to claim 7, further comprising a fourth member mounted on the first substrate or the second substrate and configured to connect thermally the first substrate and the second substrate, at least a portion of the fourth member positioned between the first non-volatile memory and the controller in a plane view of the first substrate.

9. The semiconductor storage device according to claim 1, further comprising a land mounted on one of the first face and the second face on which the first member is mounted, wherein
    the first member is brought into contact with the land.

10. The semiconductor storage device according to claim 9 wherein the first substrate comprises a conductor layer configured to connect thermally the controller and the land.

11. The semiconductor storage device according to claim 10, wherein the first member is soldered to the land.

12. The semiconductor storage device according to claim 1, further comprising an attachment unit mounted on one of the first face and the second face on which the first member is mounted, the attachment unit configured to be capable of detaching the first member from the first substrate.

13. The semiconductor storage device according to claim 12, wherein the first member comprises a first portion attached to the attachment unit and a second portion thicker than the first portion, the second portion mounted on a face on which the first member is mounted.

14. The semiconductor storage device according to claim 1, wherein the first member comprises a first wall portion positioned between the first non-volatile memory and the controller, a second wall portion surrounding the controller together with the first wall, and a third wall portion covering the controller.

15. The semiconductor storage device according to claim 1, further comprising a first heat conductive member more prone to deform elastically than the first member, the first heat conductive member brought into contact with the controller and the first member.

16. The semiconductor storage device according to claim 1, further comprising a second heat conductive member more prone to deform elastically than the first member, the second heat conductive member brought into contact with the first member and the casing.

17. The semiconductor storage device according to claim 1, wherein the first member comprises a plurality of holes.

18. The semiconductor storage device according to claim 1, further comprising an element on the first face or the second face on which the first member is mounted, wherein the first member comprises an opening configured to let the element pass through.

19. A semiconductor storage device comprising:
a substrate comprising a first face and a second face on the side opposite to the first face;
a non-volatile memory mounted on the first face;
a controller mounted on the first face or the second face, the controller configured to control the non-volatile memory; and
a member mounted on the first face or the second face, the member including an elastically deformable part and at least a portion of the member being positioned between the non-volatile memory and the controller,
wherein the member is configured to be brought into contact with an external member separated from the substrate by an elastic deformation of the elastically deformable part to thermally connect the substrate and the external member.

20. The semiconductor storage device according to claim 19, further comprising an attachment unit mounted on one of the first face and the second face on which the member is mounted, the attachment unit configured to be capable of detaching the member from the substrate.

\* \* \* \* \*